United States Patent [19]

Nelson

[11] Patent Number: 4,823,129

[45] Date of Patent: Apr. 18, 1989

[54] ANALOG-TO-DIGITAL CONVERTER

[75] Inventor: John H. Nelson, St. Louis Park, Minn.

[73] Assignee: Bison Instruments, Inc., Minneapolis, Minn.

[21] Appl. No.: 18,034

[22] Filed: Feb. 24, 1987

[51] Int. Cl.[4] .............................................. H03M 1/18
[52] U.S. Cl. ...................................... 341/139; 341/141
[58] Field of Search ............... 340/347 AD; 341/139, 341/141

[56] References Cited

U.S. PATENT DOCUMENTS

| | | | |
|---|---|---|---|
| 3,603,972 | 9/1971 | Vanderford | 340/347 |
| 3,646,586 | 2/1972 | Kurz | 340/347 AD |
| 3,947,806 | 3/1976 | Corkhill et al. | 340/15.5 GC |
| 4,129,864 | 12/1978 | Carpenter | 340/347 AD |
| 4,194,163 | 3/1980 | Gillespie | 330/86 |
| 4,219,880 | 8/1980 | Nichols | 364/718 |
| 4,297,745 | 10/1981 | Layton | 367/66 |
| 4,338,589 | 7/1982 | Engel et al. | 340/347 |
| 4,399,416 | 8/1983 | Gillespie | 330/86 |
| 4,449,120 | 5/1984 | Rialan et al. | 340/347 |
| 4,527,148 | 7/1985 | Kuboki et al. | 340/347 |
| 4,544,917 | 10/1985 | Lenhoff | 340/347 AD |
| 4,545,026 | 10/1985 | Baggett et al. | 364/724 |
| 4,554,511 | 11/1985 | Braun | 330/9 |
| 4,581,725 | 4/1986 | Pilarcik, Jr. | 367/66 |
| 4,584,560 | 4/1986 | McDaniel et al. | 340/347 |
| 4,608,554 | 8/1986 | Blair | 340/347 |

*Primary Examiner*—Vit W. Miska
*Assistant Examiner*—Marc S. Hoff
*Attorney, Agent, or Firm*—Kinney & Lange

[57] ABSTRACT

A floating point analog-to-digital converter providing a variety of analog representations of the analog signal value to be converted, each of which representations is converted to a digital equivalent from which the floating point result is obtained.

63 Claims, 4 Drawing Sheets

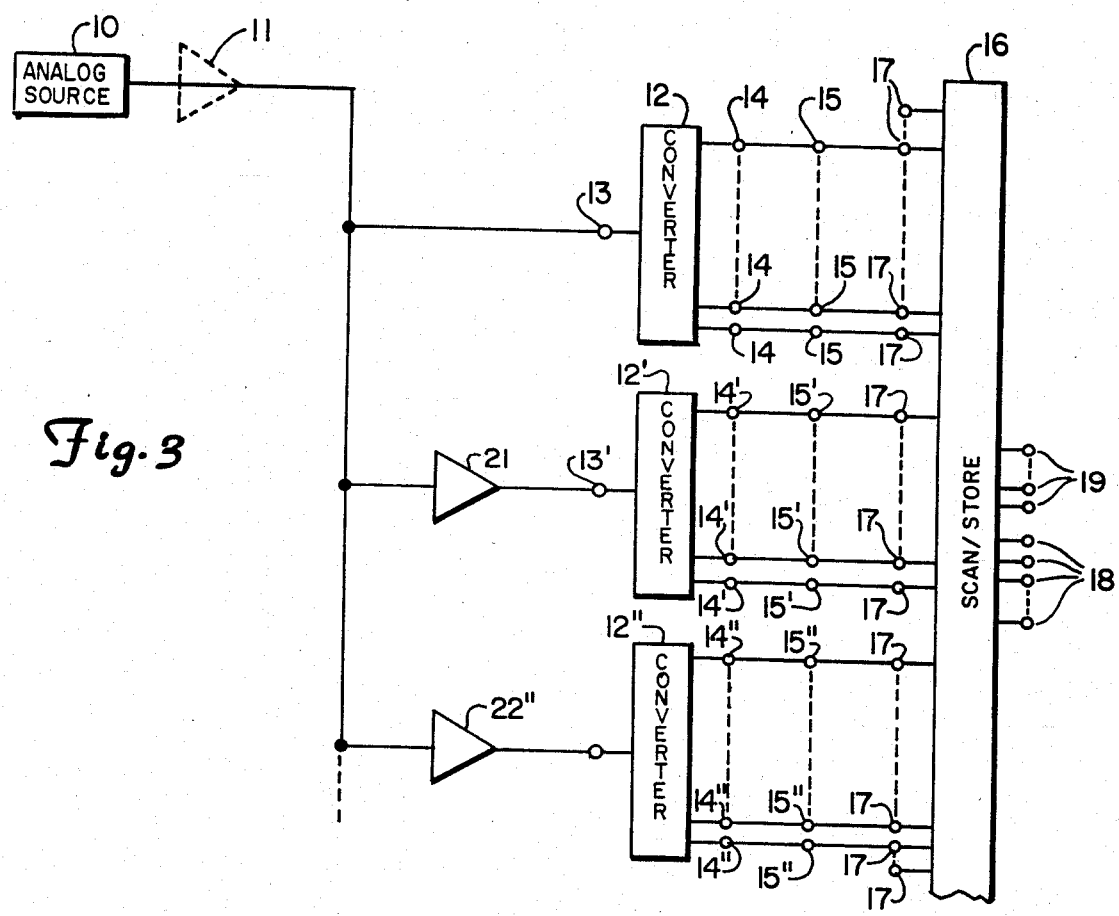
*Fig. 3*
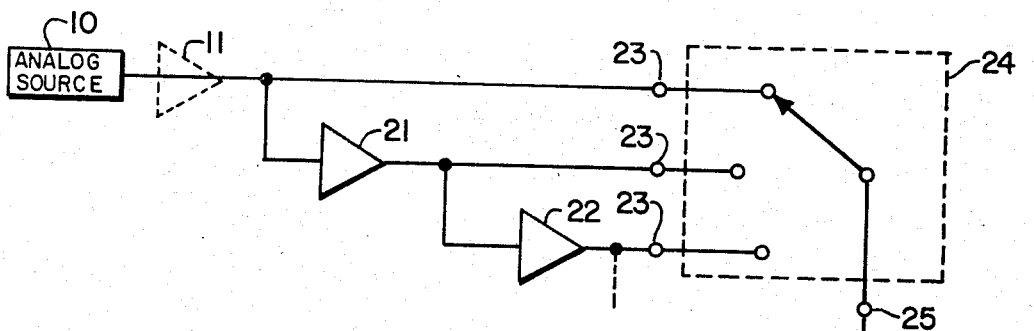
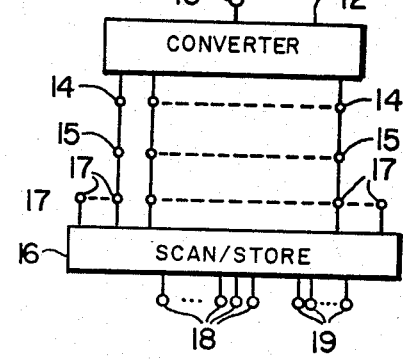
*Fig. 4A*

ANALOG-TO-DIGITAL CONVERTER

BACKGROUND OF THE INVENTION

1. Field of the Invention

The present invention relates to analog-to-digital converters and, more particularly, to converters for use with analog signals having very large dynamic ranges leading to use of floating point number digital representations.

Many analog signals provided from sensors used to measure various phenomena have very large amplitude differences between various portions of them because of the great differences in energies between various aspects of the phenomena being measured. Events to be measured often are such that the sensors yield corresponding signals with the strongest being millions of times greater in amplitude than are the weakest. As an example, the measuring of seismic events can yield signals both for ground vibrations caused by nearby powerful earthquakes and human footsteps hundreds of yards away.

Those corresponding signals obtained from sensors for measuring such events are provided as analog signals, but the usual desire is to have these measurements recorded as a series of digits forming numbers that indicate signal magnitude at selected points. Such digital representations of selected sample points of the analog signal are conveniently manipulated by digital computers in efforts to glean information from the signals. This desire leads to the need for an analog-to-digital converter arrangement which can take such wide ranging analog signals and provide suitable numerical equivalents, each representing subranges of the analog signal. The best converters for direct conversions of analog signals provided thereto that are typically available for this purpose (best in providing representation numbers with as many effective digits as possible for resolution) provide binary numbers of sixteen digits as a result of the conversion. This capability means that the number of different analog signal levels which can be resolved will be equal to two to the sixteenth power or 65,536. Such a converter can convert an analog signal which has its greatest amplitude portions being no more than 65,536 times the amplitude of the smallest signal for which the converter can provide a valid numerical equivalent. Obviously, such a converter is an inadequate means to provide numerical equivalents for analog signals having significant portions thereof which are a million or more times greater or smaller than other portions thereof.

The usual solution to this problem is to use such a direct converting analog-to-digital converter able to directly convert the greater amplitude portions of analog signals and to also provide an analog signal amplifier arrangement for smaller amplitude portions. This amplifier can have its amplification adjusted until its output signal is of a size sufficient for conversion by this analog-to-digital converter. The numerical result from the converter along with the gain used in connection with the analog signal amplifier are together used as a floating point number representing the analog signal value presented to the amplifier arrangement.

The numerical result from such a conversion arrangement is a scaled number, that is, a number scaled in size so as to be in a range which the converter can provide at its output, typically to be a number in the upper half of the numbers which the converter can provide to give a good resolution capability. The gain of the analog signal amplifier is related to a scaling number which must be used to multiply the scaled number, also called the mantissa, to give a numerical value substantially equivalent to that of the analog signal value selected to be converted. Since the smallest number representation that the converter can supply when the amplifier gain is at its maximum is also the smallest number that the converter arrangement can supply, this is defined as the system zero value. Thus, the difference between a lesser gain value used in numerical representations of other analog signal values and the amplifier maximum gain is a direct measure of the scaling number. This sort of a solution can give a capability of providing for the conversion of analog signal values over a range many times that which could be converted using the direct converting analog-to-digital converter alone.

Nevertheless, such a solution is difficult at best. Usually there are several amplifiers connected in series or parallel, or a varying gain amplifier will be used. Determining which one to use to effect a conversion, or when gain to use, considerably slows the conversion rate possible and requires expensive equipment or the risk of error of a user operating manually, or both. Such amplifiers will also each suffer from certain offset error values and gain errors which are then reflected in the analog signal as incorporated error values added to, or multiplying, the actual signal values provided by the sensor. Furthermore, the direct converting analog-to-digital converter itself will introduce errors of a similar sort. Attempts to overcome these errors will often require the use of many expensive precision components, the use of careful operator adjustments, or various rather extensive feedback arrangements, or some combination of these measures. Thus, a converter system avoiding some or all of these difficulties is desirable.

SUMMARY OF THE INVENTION

The present invention provides a converter system for converting selected analog signal values to substantially numerical equivalent values as digital signals by providing a plurality of analog representations of each such analog signal value. Each such analog representation is directly converted to a numerical representation as a plurality of digit values at least some of which will be of a substantially equivalent numerical value to the value of the analog representation converted. These numerical or digital representations will all be accepted for subsequent manipulation although they can be stored first to thereby delay such subsequent manipulation. In the subsequent manipulation, one of said digital representations for each of said analog signal values will be selected after scanning some of them, after perhaps some modifications thereto, to represent the digital representation mantissa for the analog representation with the relationship of the analog representation for such selected digital representation noted with respect to other of the analog representations to determine the scaling value. A mantissa may be selected from but a fraction of the digit values provided as a result of the converting of the analog representations to digital representations, which kind of selection may also lead to a larger scaling value. The modifications which may be made to the digital representations before such selecting will be to remove therefrom offset error and gain error components therein introduced by the converter system.

BRIEF DESCRIPTION OF THE DRAWINGS

FIG. 3 shows an alternative embodiment of the present invention,

FIG. 4A shows an alternative embodiment of the present invention,

FIG. 10 shows an arrangement to be implemented with the embodiment of FIG. 2A.

DETAILED DESCRIPTION OF THE PREFERRED EMBODIMENTS

Much of the difficulty with the usual solution described above—using a variety of amplifications of the sensor signal and to when select one which brings an amplitude within the conversion range of the analog-to-digital converter—arises in the analog portion of the system. That is, the introduction of offset errors, gain errors, noise and the slow settling time for the system while the proper gain is found are due to the analog system portion. An alternative is to elminate the determination of proper gain settings in the analog section by using a series of fixed gains to provide various analog representations of a selected analog signal value to be converted. One or more analog-to-digital converters are also used to provide digital representations of each of these analog representations. A selection of the proper digital representations is made, after perhaps modifications to the digital representations, by a scanning means which is usually a digital computer. In effect, the gain determination is done in the digital portion of the system. Further, the modifications described can result in analog error removals.

Figure 1:
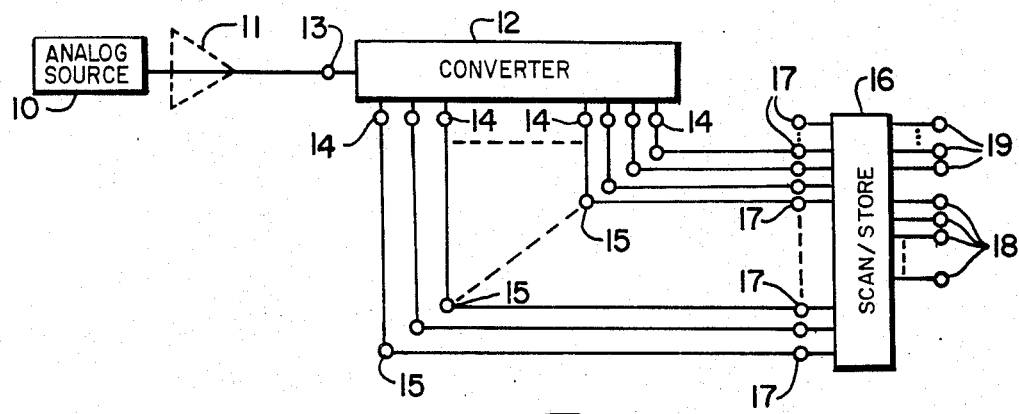
FIG. 1 shows an embodiment of the present invention.

A very simple implementation of this is shown in FIG. 1 where a sensor, 10, measuring some phenomena, provides an analog signal representative of that phenomena. This analog signal is provided (perhaps through a preliminary more or less fixed gain amplifier and frequency filtering arrangement shown in dashed lines and designated as 11) to an analog-to-digital converter, 12. Converter 12 will receive this analog signal at its input, 13, and, for selected values thereof, provide a corresponding plurality of logic signals serving as digit signals (having logic values of either 1 or 0) at its outputs, 14, being B in number. B is, of course, the largest number of digits converter 12 can provide in any numerical representation for a selected analog signal value.

If an analog signal value selected from the analog signal provided at input 13 by sensor 10 for conversion to a numerical equivalent in a digital representation is a value specified to be within the analog signal conversion capability range of converter 12, converter 12 will provide a corresponding conversion digit value combination of logic values in the output digit signals thereof. This combination will represent, typically in the binary number system, substantially a numerical equivalent of the analog signal value selected for conversion. Within such a specified capability range for the input analog signal values, converter 12 will be able to provide an alternative conversion digit value combination for each of the $2^B$ different analog signal value subranges which it can resolve in such a specified capability signal conversion range. Values selected for conversion from analog signals provided to its input 13 of converter 12, if the analog signals are within the specified conversion range, than fall within one of these subranges and so can be converted to a corresponding one of these alternative conversion digit value combinations. Each alternative conversion digit value combination has a different pattern of 1's and 0's within it to provide a different combination for each analog signal value subrange which can be converted. A track and hold amplifier may be incorporated within converter 12, or within amplifier and filter 11, to momentarily hold constant each analog signal value selected for conversion from the analog output signal provided by sensor 10 to provide a more stable basis for its conversion to a digital numerical equivalent.

However, if the analog signal value selected for conversion from the analog signal at input 13 is outside of the specified capability range of analog signal values for converter 12, the conversion digit value combination provided by the converter 12 will not necessarily represent a numerical value which is anywhere near being substantially equivalent to the analog signal value selected for conversion. Typically, if analog signal values selected for conversion are below the specified range therefore for use with converter 12, converter 12 will provide logical zeros at all B outputs 14. On the other hand, converter 12 will provide all logical ones at all B outputs 14 if the selected analog signal value exceeds, or is beyond, the specified capability range for conversions permitted for converter 12. If converter 12 is able to provide its first representation away from the value zero, i.e. its representation closest to zero, for an analog signal value of one microvolt at input 13, and converter 12 is a sixteen output or sixteen bit converter, then a signal of up to 65,535 microvolts can have a numerical equivalent provided therefore at outputs 14.

Outputs 14 are shown electrically connected to a set of interconnection terminals, 15. A digit value combination acceptance means, 16, for accepting conversion digit signals has its inputs, 17, also electrically connected to terminals 15. Typically, acceptance means 16 is a digital computer or a storage means. Also shown are acceptance means output terminals, 18, which, for a digital computer, are floating point number representation output terminals being m in number at which the mantissa is provided. A further number, x, of output terminals, 19, are shown at which a representation of the value of the exponent is made available to which a base, typically two, must be raised to provide the scaling value by which the mantissa must be multiplied to give a substantially numerical equivalent of the analog signal value selected for conversion. Typically, terminals 18 and 19 would be internal in computer system 16 but are shown here for clarity. On the other hand, if scanning means 16 where a "hard-wired" logic arrangement, terminals 18 and 19 would be, in fact, externally accessible in scanning means 16. If an acceptance means 16 were just a storage means from which conversion digit value combinations were to be retrieved for later manipulation, terminals 18 and 19 would be for such retrievals.

For a given analog signal value selected for conversion at input 13 of converter 12 that is within the specified conversion capability range thereof, an equivalent floating point representation can be provided by reducing the number of bits of resolution in the last significant bits of such representation, and considering each of those bit positions thereafter ignored as the equivalent of a gain of two. Thus, the conversion digit value combination appearing at outputs 14 of converter 12 for a selected analog signal value at input 13 can be converted into a floating point number format with a mantissa of m bits by locating the most significant bit that is a one in that combination and using it and the bit related thereto by being in the next m−1 lower bit positions as the mantissa. The exponent for the floating point number result is the relative position of these m bits from the zeroth weight bit within the full binary result provided by the direct conversion. In one words, the exponent is the number of lesser significant bits that are not included in the m bit mantissa.

In general, a single analog-to-digital converter with B output digit signals to provide a binary number system numerical representation output of B bits can, by this method, provide a floating point number equivalent with a mantissa of m bits and with up to x possible different exponents of zero to x−1 with which to raise the base two to provide the scaling number, where $x = (B - m) + 1$. The procedure for (i) locating the most significant bits, i.e. finding the most significant bit having a logic value of one and forming the mantissa from this bit and the following m−1 lower bits, and for (ii) forming the proper exponent, is accomplished through procedures arranged in acceptance means 16 as a computer or as a "hard wired" system. Results are provided at outputs 18 and 19 (or more commonly stored within the computer for further manipulation, or provided at a display or in the form of a more permanent record). That the numerical representation at the output of converter 12 is provided by an analog signal within the specified amplitude range can also be checked by the computer. Such procedure could be performed later in a digital computer if acceptance means 16 is a storage means storing each conversion digit value combination provided by converter 12 for each analog signal value selected for conversion, which greatly increases the conversion rate by putting off the scanning procedure until a convenient time.

Of course, from the above discussion it is most unlikely that many of the analog signal values selected for conversion at input 13 will come within the specified range of converter 12 for a wide amplitude range analog signal. The result for this single converter would be that if converter 12 is set to accommodate the largest analog signal from sensor 10, smaller signals would lead to few or no bits having a value of one at any output 14 of converter 12. The range of the analog signal values which can be selected for conversion can be extended from that available in the system of FIG. 1 by the system shown in FIG. 2A.

In FIG. 2, rather than one converter, converter 12 has shown with it two further analog-to-digital converters of the same nature, 12' and 12". Converter 12' has its input 13' electrically connected to input 13 of converter 12 by an analog amplifier, 21. Amplifier 21 has a relatively high input impedance and a relatively low output impedance, a gain (G) to be described below, and a time response which is adequate to pass the frequencies in the signal from sensor 10 without degredation. Similarly, input 13" of converter 12" is electrically connected to input 13' of converter 12' by a further analog signal amplifier, 22. Amplifier 22 is substantially identical to amplifier 21.

Outputs 14 of converter 12, outputs 14' of converter 12' and outputs 14" of converter 12" are electrically connected to interconnection terminals 15, 15' and 15", respectively. Terminals 15, 15' and 15" are all electrically connected also to inputs 17 of scanning means 16. Outputs 14, 14' and 14" are each a group of digit logic signals being B in number, and can each provide a binary number representation of B bits. Thus, each of converters 12, 12' and 12" are provided with the analog signal from sensor 10 but of an amplification of G times that of the preceding converter to thereby form another representation of this signal, except for converter 12 which is electrically connected directly to source 10 (but allowing for the possibility of using preliminary amplifier and filter 11. Again, there is also the possibility of using a track and hold amplifier in amplifier and filter 11 or, alternatively, in each of the converters 12, 12' or 12", etc., present.)

Converter 12 receives a signal from sensor 10 which is directly converts to output digit logic signals giving an equivalent digital representation here to be assumed to be a binary number system equivalent value. Preliminary amplifier 11, if used, will usually have a selectable gain so that the amplitude level of the analog signal from sensor 10 can be adjusted as desired. Usually the version of sensor signal 10 provided by amplifier 11 is adjusted for its maximum expected value to be within the input analog signal range of converter 12 specified for analog signal values to be converted to a substantially equivalent binary representation. With this gain setting for amplifier 11, the analog signal originating in sensor 10 in many instances will be of too small a value for its digital representation after conversion by converter 12 to provide m bits of mantissa (most significant bit in binary number representation that is a one and the next lower m−1 bits) present at outputs 14 thereof. However, that same signal may be sufficiently large after being amplified further by amplifiers 21 and amplifiers 22 to permit conversions by converters 12' or 12" to yield at one of their outputs a substantially equivalent binary representation having m mantissa bits therein.

Figure 2A:
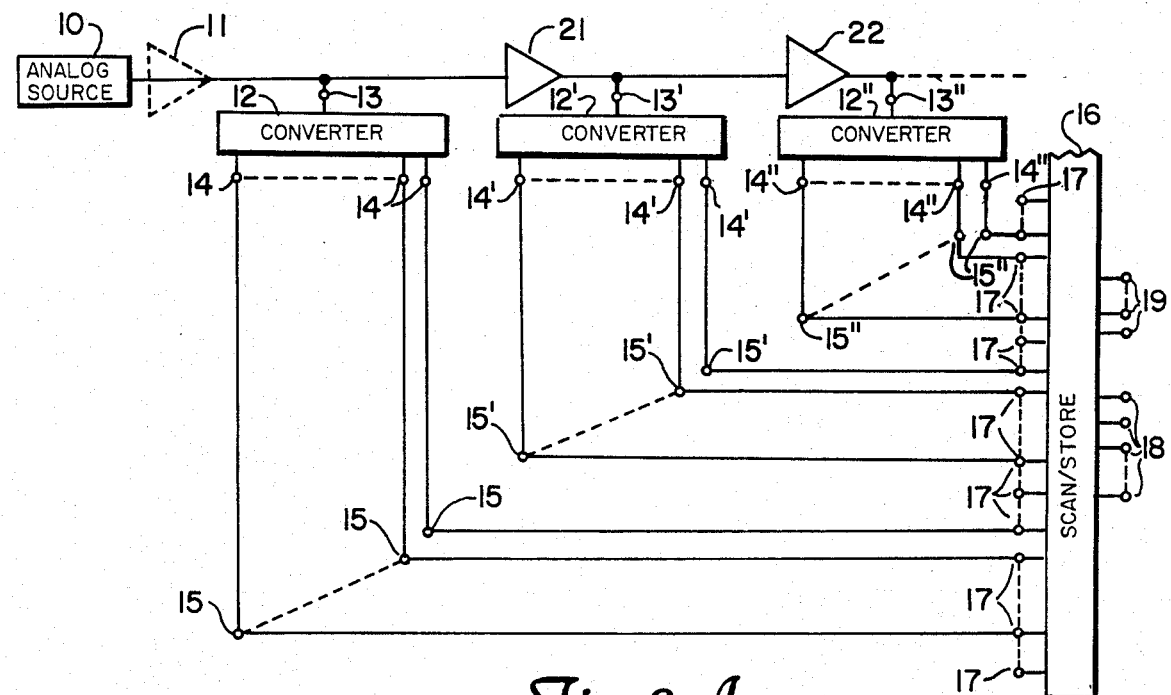
FIG. 2A shows another embodiment of the present invention.

As can be seen in FIG. 2A, a dashed line leads from the connection of amplifier 22 and converter 12" suggesting that further amplifiers and converters may need to be used to provide a sufficiently amplified signal to finally obtain a binary representation thereof having a mantissa bits therein which, as a general matter, can always be done. However, there are practical limitations, such as noise, as to how many amplifiers and converters can be used so that a signal value too small to be so represented by such a binary equivalent will be reached at some point. In any event, all m bits of mantissa must come from the same converter to obtain a valid conversion because this one converter will be the only one providing a conversion in the specified capability range for converting and the only one which has a full m bits of mantissa available. There will always be such a converter with m bits for a mantissa if the amplifiers between the converters in the chain each have proper gain relationships vis-a-vis the others as the converters on either side of such converter, if there, will either be providing digital representations (i) which have too few bits to form a mantissa, or will be (ii) providing a representation which is not of a value substantially equivalent to the analog representation at the converter input. That is, that the analog representation will be so small for that converter with the less amplified analog representation at its input than it is in an underrange condition for these purposes providing fewer than m bits of mantissa. On the other hand, a converter with a greater amplified analog representation at its input will provide an output binary representation equal to its maximum output because the analog signal is too great for the converter to provide a substantially equivalent binary representation, i.e. the converter is in an overrange, or overloaded or saturated condition.

Figure 2B:
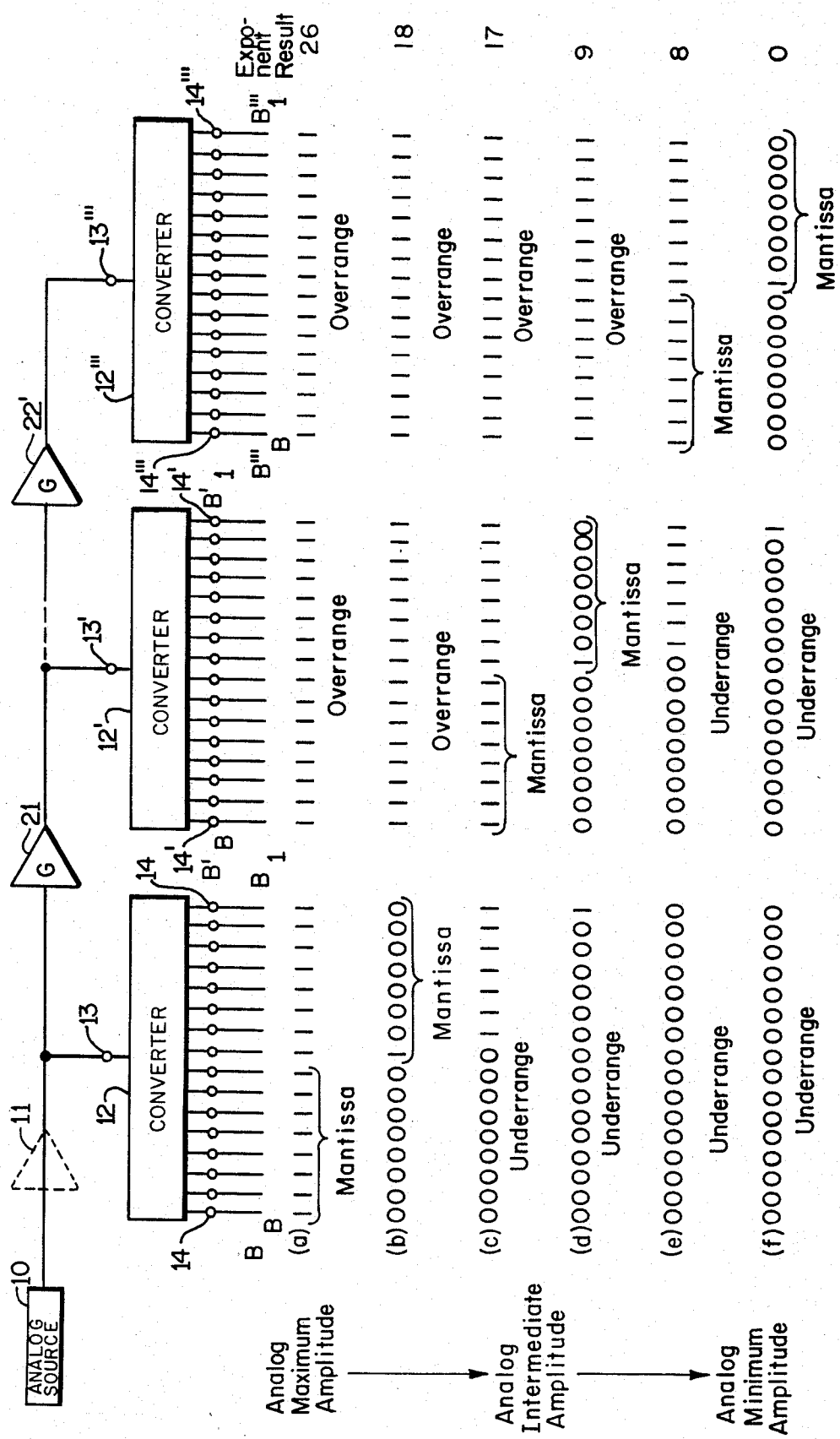
FIG. 2B shows the results of operating the embodiment shown in FIG. 2A.

Since the highest gain analog representation comes at the output of amplifier 22' at the end of the chain, the lowest value of analog signals from sensor 10 which can be converted by the converter system of FIG. 2B to a floating point number representation will lead to an m bit mantissa being provided by converter 12''. Thus, the minimum value representation provided by converter 12'' can be taken as the converter system zero value, and other mantissas from any of the converters will need a scaling value indication to give a substantially equivalent value.

FIG. 2B, on the simplifying assumption that the input analog signal is positively unipolar, or non-negative, provides an example of the operation of the system shown in FIG. 2A. FIG. 2B shows only sensor 10, amplifiers 11, 21 and 22', and B bit converters 12, 12' and 12'''. Amplifier 22' and converter 12''' represent the end of the extension indicated possible in FIG. 2A beyond amplifier 22, i.e. the end of the chain. The logic values of the digit signals at outputs 14 of converter 12, 14' of converter 12', and 14''' of converter 12''' are shown therebelow for an analog signal at the output of amplifier 11 which is decreasing as one looks down the output logic value rows of the figure from row to row. The example will assume there are just three converters present.

For the maximum signal from sensor 10 and amplifier 11 which can be accommodated by the converter system, assuming there will be an eight bit mantissa ($m=8$) in a 16 bit converter ($B=16$), the left-most eight bits at outputs 14 of converter 12 will be found by acceptance means 16 to provide the mantissa as shown in output logic value row (a). The eight bits of lower significance from converter 12 will have their value discarded making relatively little difference in the foating point number which will represent the equivalent of the maximum analog signal value. On the other hand, the count by acceptance means 16 of those digit positions corresponding to these digit signals below the matissa, and those available for gain steps in converters 12' and 12'', will represent the exponent to which the base two must be raised to give a scaling value by which the mantissa must be multiplied to provide the substantial equivalent of the maximum analog signal value. This follows because shifting the mantissa left from the zero value position in converter 12''' would double the value of the representation for each digit position shift left until the mantissa position under consideration is reached. There can be only $(B-m)+1$ shift positions provided in each converter and still return a full mantissa therein. Thus, the value represented at the outputs of converter 12 will be $255 \times 2^{26}$ units of the smallest increment value convertible by converter 12'''.

The logic values of the digit signals at outputs 14' of converter 12' all the way through outputs 14''' of converter 12''' will be all ones indicating these converters are in an overrange condition. Therefore, acceptance means 16 determines that the mantissa must be taken from a converter having the smaller analog signal value applied thereto up the chain of amplifier-converter chain.

Example (b) shows the results of a smaller analog signal being provided by sensor 10 and amplifier 11, one that is just small enough to provide eight bits for a mantissa in converter 12, still leaving converters 12' and 12''' in an overrange condition. The value represented here in binary form is $128 \times 2^{18}$ since there are no digit positions to the right of the matissa digits in converter 12 so that the base two is to be raised by the exponent 18 to form a scaling factor because of the shifting positions established by amplifiers 21 and 22 in converters 12' and 12'''.

Example (c), however, is for an analog signal from amplifier 11 having an amplitude which is too small to provide eight bits in converter 12, there being only seven bits represented in converter 12 taking the most significant bit having a value of one and the bits to the rights thereof. Since in the binary number system multiplication by two is equivalent to shifting one position to the left, eight digits could be provided in converter 12 if the analog signal from amplifier 11 was doubled in amplitude by a transition gain step. That being done, just as clearly the eight bit mantissa could be shifted to the extreme left end of outputs 14 of converter 12 by doubling the signal from amplifier 11 eight further times. Thus, an analog signal from amplifier 11 which is just the size to cause one bit of the desired m bit mantissa to not be represented at outputs 14 of converter 12, could be doubled nine times to leave the eight bit mantissa at the extreme left of the outputs 14 of converter 12.

This, in effect, is what is done by having amplifier 21 provide a fixed gain of $2^9$ before the analog signal from sensor 10 and amplifier 11 is applied to input 13' of converter 12'. The result is shown of seven bits appearing at outputs 14 of converter 12 but a full eight bits appearing at the left-most outputs 14' of converter 12'. Thus, the mantissa for the floating point number to represent the analog signal amplitude provided in example (c) is not taken from outputs 14 of converter 12, since eight bits cannot be obtained there, but instead from the left-most outputs 14' of converter 12' to give a value of 255 just as found for the mantissa in the example (a). The scaling factor is found again by raising the base two to a power represented by the number of output positions to the right of the mantissa in converters 12' and 12''', to account for the gains in amplifier 21 and 22 used to establish the converter system zero value with the last converter in the amplifier-converter chain. These gains, as already indicated, establish nine shifting positions in each of converters 12' and 12''' for $m=8$, $B=16$. This gives a scaling factor of $2^{17}$. As a result, the floating point number represented in example (c) has a value which is $\frac{1}{2}^9$ of the value represented by the floating point number in example (a). Converter 12''' for this analog signal supplied by amplifier 11 is in an overrange condition, while converter 12 with respect to this signal is in an underrange condition. Example (d) again shows the result where the signal supplied by amplifier 11 is just large enough to provide a full eight bits for the mantissa in converter 12' while the signal is such that converter 12 is in an underrange condition and converter 12''' is in an overrange condition.

Examples (e) and (f) are parallel to examples (c) and (d) but for converters 12' and 12'''. That is, example (e) is of an analog signal from amplifier 11 just small enough so that the representation at outputs 14' of converter 12' do not provide a full eight bits for a mantissa in converter 12' and are therefore provided in the left most position of converter 12''' after multiplication by $2^9$ by amplifier 22'. Example (f) is of the situation where the analog signal is at its minimum level for presenting a full 8 bits of mantissa at the outputs of converter 12''' for which input 13''' is electrically connected to receive the analog representation of the signal from sensor 10 which is of the highest amplitude because of having the greatest gain applied in its formation. This signal would have a value which is $\frac{1}{2}^{18}$ that of the signal given in example (b).

As can be seen from the foregoing, the requirement that a mantissa of a selected size be fully provided to acceptance means 16 by a single analog-to-digital converter in the amplifier-converter chain places some limits on (i) the number of bits which can be provided in a mantissa, which is a limit on accuracy, and (ii) the number the exponents which can be provided for raising the base two, i.e. the gain steps which are available in forming a floating point number representation. As indicated above, the gain steps available in a converter are the maximum number of outputs to the right of the mantissa plus one or (B−m)+1 steps. An amplifier between adjacent converters must supply enough gain for those steps which assures that the mantissa would be changed from being one bit too small in the converter on the left to just filling the most significant positions of the converter on the right. That is, the gain of the amplifier between two converters having B digit signal outputs, or B bits, for a mantissa of m bits cannot be more than $2^{[(B-m)+1]}$ to assure an m bit mantissa can be found in one converter or the other for analog representations provided thereto at the transition amplitude.

The gain also cannot be smaller because then for analog representations of the transition point between adjacent converters there can be formed two dissimilar m bit mantissas, one from each of the converters. In these circumstances, an increasing or decreasing analog representation will lead to a sequence of floating point conversions with a sudden shift in values as these binary representaions being selected are switched from one of the adjacent converters to the other to get a full m bit mantissa.

Thus, the total number of exponents available for raising the base two to provide scaling factors, i.e. gain steps, which are available is the number of analog-to-digital converters C used times the number of gain steps made available for each by the amplifiers used therebetween or C[(B−m)+1]. As is easily seen from these formulations, there is a tradeoff between the number of bits m used in the mantissa which controls accuracy of representation of a corresponding analog signal value and the number of gain steps which controls the range over which such analog signals can be represented. That is, for instance, assuming the use of three analog-to-digital converters each providing sixteen digit signals or sixteen bits of binary representation, for the analog signal values applied thereto, that the conversion system of FIG. 2A could provide mantissas of twelve bits over a range of fifteen gain steps. Alternatively, if a mantissa of eight bits were satisfactory, then the range of gain steps would be twenty-seven. The mantissa length is limited only to being of no more than B bits in length so as to meet the requirements that it must be obtained from a single converter. Any smaller number greater than zero can be used if the user's accuracy requirements are met thereby, whether an even number or an odd number.

Each of the analog-to-digital converters in FIG. 2A is shown directly electrically connected to input 17 of scanning means 16 for performing the scanning procedure to determine (i) which of such converters has a full mantissa available thereon, (ii) where it is located in the outputs of that converter, (iii) how many bit positions there are to the right of the mantissa positions at the converter outptus, and (iv) the number of multiplication steps provided by the amplifiers between the input to that converter and the end of the amplifier-converter chain. However, more typically, these converters would have their outputs connected to a data bus where a computer is used as scanning means 16. Another possibility is that the outputs of the converters would be connected to a multiplexer arrangement which in turn is connected to the data inputs of a computer used for scanning means 16.

A further alternative would be to have acceptance means 16, instead of the nature just described in being either a "hard-wired" system or a computer system, being a storage means receiving such converter outputs and merely storing them until they can more conveniently be retrieved therefrom and scanned by a computer means to obtain the proper floating point representation for each analog signal value converted. The situation first described where acceptance means 16 is a scanning means allows a "real-time" system, or "near real-time" system, to be provided by the converter system of FIG. 2A. In the alternative, acceptance means 16 is a storage means which is later connected to a retrieval means for providing the stored converter outputs to a scanning means. This arrangement permits obtaining the data of interest in a relatively small unit since the scanning means need not be included in this unit. The retrieved outputs can then be manipulated to find the proper floating point representation at a more convenient location or time.

Further alternatives to the system shown in FIG. 2A are possible. FIG. 3 shows an arrangement where an amplifier, 22'', has been substituted for amplifier 22' and is also directly connected to the output of preliminary amplifier 11. The system in FIG. 3 can provide the same result as the system of FIG. 2A. For this to occur, the gain of amplifier 22' and any further amplifier and analog-to-digital converters used thereafter down the chain must be increased because the signals applied to the input of such amplifiers will not have been amplified by any of the previous amplifiers as they are in FIG. 2A. Thus, these amplifiers will require larger gains but will not amplify errors introduced by previous amplifiers.

Figure 4B:
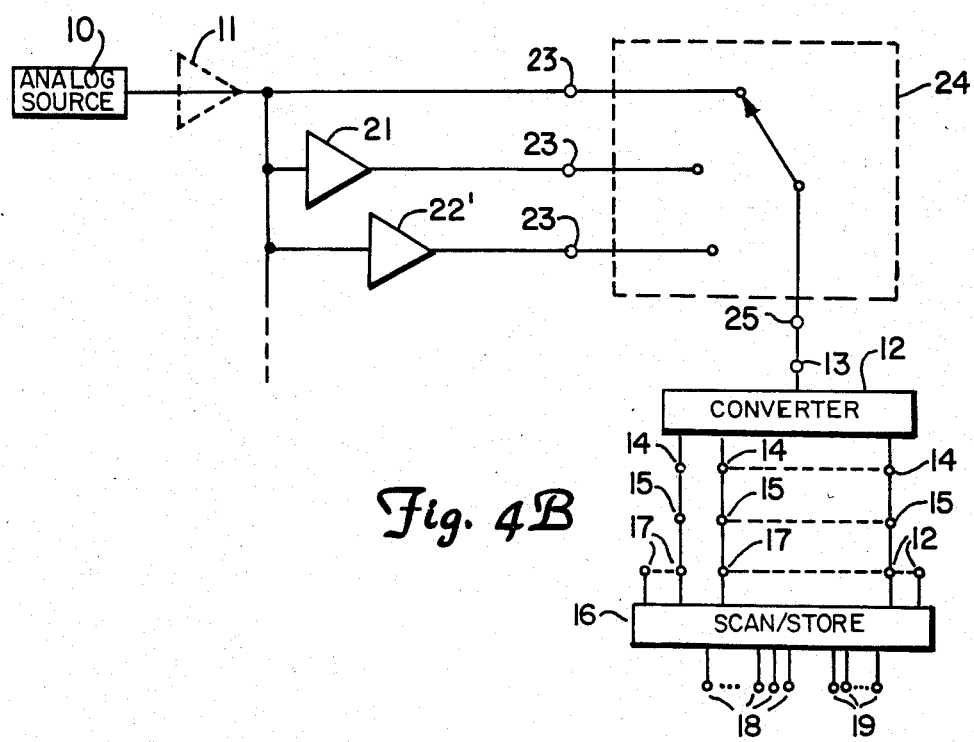
FIG. 4B, shows an alternative embodiment of the present invention.

The system shown in FIGS. 4A and 4B can each also provide the same conversion results as are provided by the systems shown in FIGS. 2A and 3, but with the use of only one analog-to-digital converter (which again may incorporate a track and hold amplifier). Since such converters are usually one of the most significant components insofar as cost is concerned in such a system, a substantial savings can be obtained using the systems of either FIG. 4A or 4B. The disadvantage comes from the requirement that each of the conversions of an analog representation of the selected analog signal value from sensor 10, and amplifier and filter 11 if used (perhaps with a track and hold amplifier), must be done sequentially, which substantially slows the conversion of the selected analog signal value to a floating point number equivalent.

The circuit of FIG. 4A parallels that of FIG. 2A in that each selected analog value provided by sensor 10 and amplifier and filter 11 has an analog representation thereof provided by successive amplifiers in a cascade or chain of such amplifiers, including amplifiers 21 and 22 shown in FIG. 4A. However, each of these analog representations are provided to inputs, 23, of a sequentially operated switch, 24, which in sequence connects each of such inputs to a switch output, 25, which is electrically connected to input 13 of analog-to-digital converter 12.

The switch contact arm in switch 24 sequentially connects each of the inputs to switch output 25 for each analog signal value which is to be converted to a floating point number equivalent to thereby provide sequential analog representation to output 25 of switch 24. Converter 12, connected to switch output 25, converts each sequence of analog represetntations for an analog signal value to a sequence of binary representations to form the basis of selecting a floating point number equivalent for the analog signal value. These values are obtained by acceptance means 16 for either storage or for scanning to obtan therefrom that one which has full m bits provided or the mantissa and which has binary representations provided at switch inputs on either side thereof which cause converter 12 to be in an underrange or overrange condition.

FIG. 4B is analogous to FIG. 3 in that the amplifiers there are not in a cascade, but are connected to inputs 23 of switch 24 in parallel and so do not benefit from the amplification provided by the amplifiers above it. Of course, neither do these amplifiers amplify the errors caused by the amplifiers above them. Switch 24 in either of FIGS. 4A or 4B can be a multiplexer means.

Figure 5:
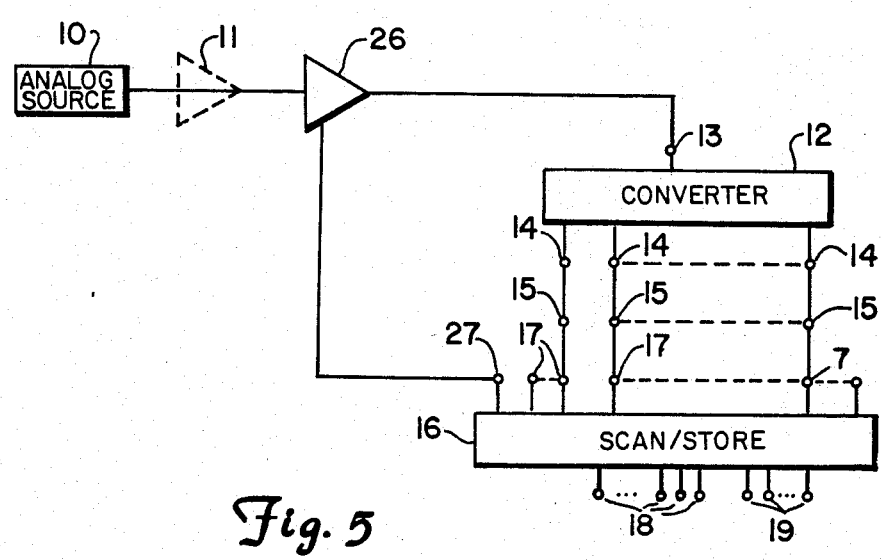
FIG. 5 shows an alternative embodiment of the present invention.

The converter system of FIG. 5 relies on a single varying gain amplifier, 26, which is operated by acceptance means 16 in the form of a computer or of some controlled clocking circuit, directing a series of gain changes to, in effect, provide the action of the circuit of FIG. 4B. Thus, the system of FIG. 5 can provide the same conversions to floating point numbers as can the system of FIG. 4B, and the other previously described systems. For each analog signal value selected from sensor 10 for conversion to a floating point number equivalent, after action thereon by preliminary amplifier and filter 11 (possibly with a track and hold amplifier), if used, amplifier 26 provides a sequence of fixed gain steps to that selected signal value to provide a sequence of analog representations for that value.

Each of these analog representations, one being equal to the selected analog signal value and the others all being greater by the substantially fixed gains of each step, are converter by converter 12 (possibly incorporating a track and hold amplifier) to a binary number system representation. One of these binary representations will have m full mantissa bits therein while the ones formed from analog representations, formed with higher or lower gains, will be such that converter 12 is in an underrange or overrange condition. All of these representations are accepted by acceptance means 16 and either stored for later retrieval followed by scanning, or immediately scanned, to select therefrom that one having the proper number of mantissa bits. The mantissa is provided at outputs 18, and the exponent to which base 2 must be raised to provide the proper scaling value is provided in the binary number system at outputs 19 in the same sense as indicated above.

A computer used in acceptance means 16, with logical clocking and command circuitry therein, provide signals to an output, 27, in acceptance means 16 through which it commands amplifier 26 to provide such a sequence of gain steps, or changes in gain. A full sequence of gain steps occurs during the time a selected analog signal value is present at the amplifer input to thereby provide the analog representations indicated for each such selected signal value coming from amplifier 11 (although this sequence could be terminated after a satisfactory manttissa is found).

The system of FIG. 5, while using only one amplifier 26 and only one analog-to-digital converter 12, takes a longer time to make a system conversion than does the system of FIG. 3 for the same reasons the systems of FIGS. 4A and 4B do. That is, the necessity of sequentially making conversions rather than doing them simultaneously adds to the conversion time. Also, while FIG. 5 uses only one amplifier 26 and one converter 12, a more complicated kind of amplifier is required in being a varying gain amplifier. Such an amplifier may itself introduce somewhat more error than any one of the simplier amplifiers shown in FIGS. 4A and 4B because of such complexity. Further, a control arrangement for setting the gain of amplifier 26 must be provided and, while it need not be provided by acceptance means 16 as shown in FIG. 5, nevertheless some provision therefor must be made.

As can be seen for all of the systems shown in FIGS. 2A, 3, 4A, 4B and 5 there is no methodology or apparatus for the selecting of any analog gain to be applied to the analog signal value before being converted to a floating point number representation. In effect, all gain selections are made in the digital portion of the system because there is no discrimination in the analog portion—all analog representations for each analog signal value selected for conversion to such a floating point number are converted to binary equivalents which are accepted by acceptance means 16. Thereafter, these binary equivalents are scanned either immediately or later after retrieval from storage, as is convenient, to determine which of these binary system representations is a proper one to represent the floating point number equivalent.

Thus, the system can be very rapid in operation in obtaining data for converting selected analog signal values to floating point number equivalents. There need be no delays for any decision-making in selecting which analog representation provided by an amplifier of a selected analog signal value is to be converted for representing the selected analog signal values as floating point numbers. This is because the scanning to select the right one of the various binary number representations can be done quite rapidly by scanning means 16 as a computer. Faster yet, such scanning can be postponed altogether until a later time while obtaining the selected analog values for conversion to a floating point number. Yet all the information about each such selected analog signal value can be retained in storage in a binary number representation for later scanning.

A further benefit comes because every floating point number representation of a selected analog signal value has a full resolution of m bits. Repetitions of planned seismologic tests, each measured and recorded by the converter system, can be performed with each resulting selected analog signal value in each test being converted to a floating point nubmer equivalent by such converter system. This can be followed by "stacking," i.e. combining, the results of each such test together at similar relative points in time with respect to initiation of the test to yield much more accurate statistical representation of the second event. The random aspects of each of the test signals tend to cancel, leaving the desired repeatable portion reinforced from each such test.

In most situations, however, further aspects of the converter systems of these figures must be considered for reasons partly alluded to above in the assumption that only unipolar signals are present, and in the acknowledgment that errors are introduced in the various amplifiers. Inevitably, in analog system components, there will be offset errors and gain errors introduced which will lead to analog signal values for being converted to floating point representations that are not the actual analog signal values which should be converted because of the introduction of errors therein. Not only do amplifiers shown for the above systems introduce offset and gain errors, but so do the analog-to-digital converters used in these systems to provide the output binary number representation of the analog signal occurring at their respective inputs, whether in or out of the range specified for analog signals being converted by such converters.

The systems of FIGS. 4A, 4B and 5 do reduce, on a relative basis, the system errors due to differences in gains of amplifiers and converters used thereon—from that which is desired over the system errors that occur due to the same differences in these components in cascades thereof, such as in FIGS. 2A and 3. This follows simply because fewer of these components are used in the systems of FIGS. 4A, 4B and 5. Nevertheless, the gain and offset errors inherent in each one of the devices alone are still significant in their effect on the converter system unless extreme efforts and costs are undertaken to reduce such errors, errors which in the end can never be reduced to zero.

Consider analog-to-digital converters which provide binary number system equivalent outputs and which have zero as the lowest output and $2^B - 1$ as the grestest output for a given range of unipolar analog input signal values. In probably most situations there will, rather than unipolar signals, be bipolar signals from which selected values are to be converted to floating point number representations. To do this, a precision rectifier could be used to convert the bipolar signal to two unipolar signals, each of which could be provided to any of the systems shown in FIGS. 2A, 3, 4A, 4B or 5. Using this duplication of systems, one for each unipolar signal, could increase component cost but give a full range of use of each converter with respect to its corresponding unipolar signal.

Another method would be to use an absolute value circuit which provides an output which is always unipolar and an algebraic sign indicator. The unipolar output could be supplied to such unipolar input signal converters, and the sign indicator could be provided directly to the acceptance means.

Most cheaply and conveniently, however, would be to use bipolar input signal converters to provide bipolar output capabilities by merely equating a zero value for the analog input signal to a reference binary number system representation in approximately the middle of the range just described. In this manner, the binary representation for a zero would be the most negative signal level permitted for the analog input signal values and the highest binary output where all bits take on a logic value of 1 would correspond to the most positive input analog signal value permitted.

This binary reference value in approximately the middle of the binary number range, which is defined to be the number which an input analog signal value of zero would take, can then be stored in scanning means 16 to be substracted thereby from each of the binary number system representations provided thereto after conversion by the corresponding analog-to-digital converter the so modified binary number representation is then a representation given with respect to the analog zero value. Such a substraction will convert the binary number system representation provide by the analog-to-digital converter into a representation with respect to the zero value for the analog signal sample which is in the 2's complement form. The resulting digital representation can be continued in 2's complement form, or can be converted to sign and magnitude form as is convenient (such a conversion being accomplished by (i) noting polarity and doing nothing more if positive, (ii) but if negative, complementing all bits in the digital representation, adding one thereto, and then complementing the sign bit). For clarity, a sign magnitude representation will be used in the subsequent example.

Figure 6:
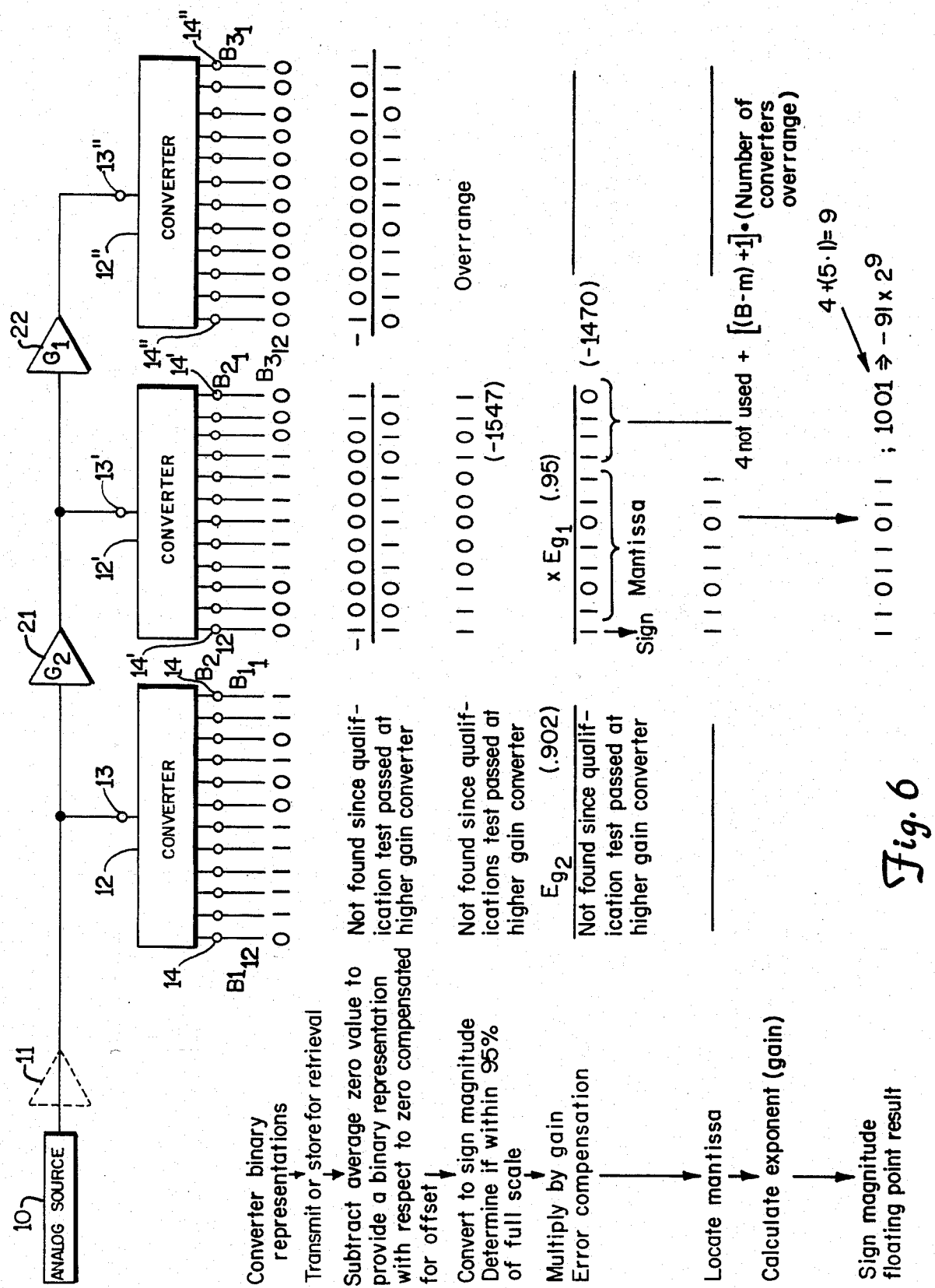
FIG. 6 shows the results of operating in another mode the embodiment shown in FIG. 2A.

FIG. 6 presents a further example based on the system of FIG. 2A where each of the analog-to-digital converters have twelve digit signal outputs, i.e., B=12. There are just three converters in this example, these being designated 12, 12' and 12''. The results from these converters in the floating point converter system in having operated on an analog signal value, selected from the analog signal provided by sensor 10 and preliminary amplifier and filter 11, is shown in the first row of FIG. 6 below the converters 12, 12' and 12''.

Thus, converter 12 provides a binary number representation for that analog representation of the analog signal value selected for conversion which is just identical thereto. Converter 12' provides a binary representation of this same analog representation of the analog signal value selected for conversion but which is just $G_2$ times this selected analog signal value. Similarly, converter 12'' provides a binary representation for the analog representation that is $G_2G_1$ times the selected analog signal value. These converter binary number representations are what is shown in the first row of FIG. 6 with 12 bits in each.

As can be seen in the second row, a reference value has been subtracted by scanning means 16 (not shown in FIG. 6 but arranged as in FIG. 2A) from each of the converter binary representations to provide a binary representation with respect to zero. Note that a different reference value has been subtracted from each converter binary representation. That the same reference value is not used for each of these converters 12, 12' and 12'' is related to the offset removal procedure which will be described below. Equal reference values would be used if there were not differing offsets in effect at the outputs of each of these converters. As indicated, the result of the subtraction is binary representation in the 2's complement form. The following step is shown in FIG. 6 is the result of converting to a sign magnitude format in the manner indicated above.

As set out above, the floating point converter systems shown in each of FIGS. 2A, 3, 4A, 4B and 5 will each, in the countermeasures, have a resultant overall offset in the conversion values provided. At the very least, such system offsets will be introduced by the presence of offset values in the results at the output of each amplifier and analog-to-digital converter used on an individual basis, component offsets which even if not immediately present will be with the aging of these components. System offset means that there will be some value, positive or negative, added to the actual analog signal from sensor 10 (and perhaps added to offsets introduced by sensor 10 and amplifier 11). Similarly, each component will add a positive or negative value to the signal value applied to the input of the component. Such offset values can be compensated, at least temporarily, by analog circuit means in the analog electronics portion of the converter system to return the analog signal to representing without offset the true measurement value from sensor 10, but such compensation varies with temperature and the aging of the analog circuit components.

An overall offset occurring in any of these converter systems is undesirable as there results a limit on the analog signal magnitude range over which such converter systems can operate. More significantly, however, is the fact that there will be different individual offsets from the different analog components. These differences in offsets are more significant because of the errors such differences can introduce in the floating point number representations found for the analog signal values selected for conversion to such a floating point representation. These differing offsets, such as in effect at the outputs of adjacent members of pairs of analog-to-digital converters in chains thereof in FIGS. 2A or 6, can be so great with respect to the least significant bit of one member converter and the most significant bit of the other converter that the two converters might each provide a seemingly acceptable mantissa of m bits each, or alternatively, neither would provide an acceptable mantissa.

As an alternative to analog, scanning means 16 could subtract from each converter output binary representation the binary value that such a converter actually yields as a binary representation for an analog representation at its input of zero rather than subtracting the reference binary value that be provided for such an input. The binary value defined as the zero binary representation for a zero analog value input is a basis for providing bipolar signal capability. Any offset is thereby removed in the resulting binary representation with respect to zero.

Figure 7:
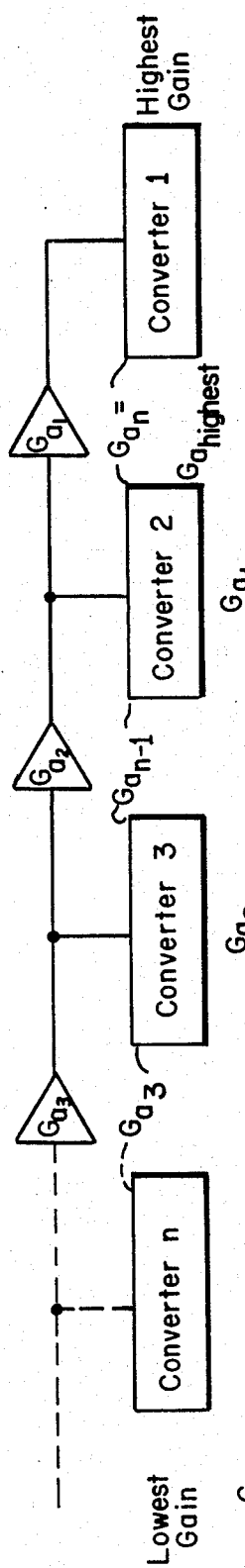
FIG. 7 shows an illustration of another aspect occurring while operating in the mode of FIG. 6.

An example of the results of such a procedure is shown in FIG. 7 for one of the converters having an offset with the value of 128 in the decimal number system. In the left-hand column, a series of analog representation values, listed as inputs to this converter, the values being given in decimal. The resulting converter binary representation of these inputs with the effective converter offset of 128 introduced therein is given in the next column with the decimal equivalent value in parantheses to the right. The resulting reference value of 100000000000 plus an added offset of a positive 128, or 10000000, is set forth in the next column with a minus sign before to indicate subtraction. The binary representation offset compensated result in 2's complement is given in the following column. Note that where the second column had a value of 128 for a zero value analog representation input, this binary representation offset compensated result has a true zero result showing that the offset has been removed.

However, this good result is tempered by a further effect in that there is no longer a symmetery between the maximum positive and the maximum negative 2's complement values which can be provided by the analog-to-digital converters, so offset compensated, over its range of valid conversion for analog input siganal values. The converter ordinarily would give a result from −2047 to +2047 as a 12-bit bipolar signal converter. The offset compensation subtraction, barring converter imposed limits in the range of analog signal values convertible, shifts this range so that the binary representations thereafter cover an analog signal range from −2175 to +1919. Thus, so long as there is an offset present to be corrected in the analog representation signal, and the compensation scheme just described is used, there will never be any binary representations provided by the converter at one end or the other of the analog signal conversion range previously available, the end from which representations were missing depending on the offset value polarity. For an offset of +128 in a 12 bit converter, the missing representations are between +1919 and +2047.

The absence of any binary representations in this range for the analog signals could result in a large error at the transition point between shifting from one converter representation to that of the other for a pair adjacent analog-to-digital converters in a chain of same for the purpose of determining which is to provide a full m bit mantissa. That is, a transition between converters in such a pair occurs for a change in value of the analog representation input signal which is of a magnitude just equal to, or greater than, the smallest change to which the converter can respond by a corresponding change in its least significant bit position and which would cause the representation of a full m bit mantissa to move from the converter to one adjacent thereto. In this situation using the offset removal procedure illustrated in FIG. 7, such a nominal change, occurring as a decrease in the analog input signal, could lead to the converter on the right to which the transition is made, which receives an analog representation of a higher gain and which exhibits such an offset, to provide a binary number representation which changes by the full amount of the offset from the binary representation just previously given by the preceding converter to the left. Then, there would be no further change in the binary representation from this second converter as the analog input signal decreased until that analog representation signal decrease is greater in value than that of the offset.

This unwanted effect of the compensations procedure of limiting the range of analog signal values for which a converter can provide binary representations described above can, however, also be corrected in a further compensation procedure provided for the purpose of compensating the gain errors occurring the analog portion of the system. This compensation will be described below. (Note that the lower limit of the converter's ability to provide appropriate binary number representations for each level of analog input signal is limited to −2047 so that the lowest level signal will always be −2047 even though a lower representation should appear for lower analog signal values on a corresponding substantial equivalence basis).

To put into practice this compensation procedure, scanning means 16 must determine, or be provided the information, as to what the actual binary representation of a converter is for a zero value analog representation applied thereto, and must do so for each analog-to-digital converter used in the chain. Actually, scanning means 16 must so determine this for a zero value analog signal applied to the converter system input so that any offset values in the corresponding amplifiers for a converter are also compensated along with the offset in a converter. Alternatively, scanning means 16 must determine or be given the binary representation for a zero value analog representation signal for each gain level if the same converter is used several times as is the case in the converter system shown in FIGS. 4A, 4B and 5.

This actual binary representation zero value could be determined by providing a zero value input test signal to the converter system input, but another procedure is more convenient. Over a sufficiently long period of time, the average of proper bipolar analog representations not affected by the offsets is expected to be zero. This follows because positive and negative levels of analog representations are usually equally likely, typically, because some sort of a coupling capacitor is usually used in connection with sensor 10 to remove any constant signal biases. This likelihood of positive and negative signals over a sufficiently long time also follows because the phenomena being measured by sensor 10 usually come to a rest without biasing sensor 10 and, in any event, a bias in sensor 10 revealing itself as an offset would be removed by the present procedure. The period of time for such average to be sufficient must be one that is much greater than the period of the lowest frequency in the analog signals that will be subjected to conversion by the analog-to-digital converters as a basis for obtaining a substantially equivalent binary representation.

An offset value is essentially a constant value added to proper analog signals, and will appear as a constant value added to the binary representation resulting from converting such corrupted analog signals in the various converters. Thus, the average of the binary representation outputs of a converter over a sufficiently long time will result in the desired binary representation for the zero value of offset ridden analog representation input signals for that converter and its corresponding amplifiers up the chain. This again, is a sum of just what a proper zero reference value binary representation should have been pulse the offset value for that converter, and is what must be subtracted from the binary representations provided by that converter for each analog representation converted by it to thereby remove the offsets from the binary representations.

Scanning means 16 could simply average the binary representations provided by each converter for an analog representation over a long time, typically 10 times the period of the lowest frequency signal expected to be provided to the converter input. An equivalent result could be obtained by averaging several shorter term averages which, in effect, provides digital low pass filtering of the average values. This procedure is followed here as is shown in the flow chart of FIG. 8. The most recent value determined for the average is used for compensating each converter output binary representation as described above.

A sum (S) is accumulated by scanning means 16 for each analog-to-digital converter, either used in a chain or used singly, in one of the converter systems described above, of some relatively large number (N) of the binary representations provided by that converter. The average of these representations for use as an offset compensating zero value (Z) is found in scanning means 16 by dividing the sum S by the number N of representations accumulated therefor, or $Z=S/N$. The sum S is then divided by two and N/2 additional representations are added thereto. The average Z is again calculated, this new sum is again divided by two and the procedure repeated. One-half of the previous sum is retained each time so that the average Z is for a longer period than the time it takes to sum N/2 representations to restrain response to any one offset shift to provide stability. If the number N is set to some power of two such as 256 or 65,536, these average calculations can be done very quickly since division can be avoided, and a mere shift in the binary system accumulation register provides the effect of division.

The scanning means can provide this procedure for each converter in the floating point conversion system continuously whenever the instrument is not recording to thereby form a real-time instrument. Scanning means 16, in connection with an instrument which stores the converter outputs for later retrieval and scanning, can operate continuously during the entirely of such a scanning to provide the corresponding floating point representations. Such a continuous providing of the most recent offset correction factor allows compensation to begin quickly for changes in offsets, and to approach completion in a reasonable response time, to readily provide new compensation in face of any offset changes which occur. Note that the finding of an average can be done more quickly after starting if the initial sum and average determination is skipped and an assumed sum such as N times the operator's expected value of Z were inserted as the initial sum.

As just described, the introduction by analog portions of the converter system of offset values, added to properly measured values, can cause substantial difficulty because (i) the offset values differ from one analog-to-digital converter to the next in those situations where a plurality of converters are used in a computer system, or (ii) differ from one amplifier or gain setting to the next if only one converter is used. The greatest difficulty in this situation occurs at transition points where the mantissa is taken from an adjacent converter because the input analog signal is at least a least significant bit in value too low for the previous converter to provide a full mantissa. In the same manner, even if one converter is used, there may be offset differences between various amplifiers providing analog representations to, or between various gain steps in a varying gain analog amplifier providing analog representations to, such a converter. In either case, the procedure described for removing offsets introduced by the converter system can be used if such offsets are desired to be removed.

Similarly, gain errors manifest themselves in problems most acutely about the transition point between having one of two adjacent converters representing a full mantissa when the other has its analog input representation too small or too large by at least a least significant bit to provide a full mantissa. Again, the situation can occur for gain errors in the converters themselves or in amplifiers which are intended to provide a selected, and predetermined fixed gain, or errors between gain steps of a varying gain amplifier each of which steps is intended to provide a selected but predetermined fixed gain. There will be several points in the input analog signal range at which values selected for conversion have differences between them which lead to a change of a least a least significant bit in the conversion value after amplification, if any, which will cause an m bit mantissa to be formed at the output of the next converter, or from the analog representation of the next amplifier or the next gain step. Since those small differences in selected analog signal values are so crucial at the transition points, clearly the gain difference between adjacent analog representations must have an accuracy of better than the least significant bit in the mantissa to be provided. That is, at the very least the fixed gains to a converter output must lead to gain differences between adjacent converters, or adjacent analog representations, which have an accuracy of better than one part in $2^m$ to avoid certain error in the floating point number representations to be provided.

However, at transition points of the nature just described for analog signal values selected for conversion to floating point operations, errors can occur at least occasionally if the least significant bit in the binary representation provided by an analog-to-digital converter should, because of relative gain problems, be subject to having an error occur therein. Thus, to have a converter system which appears to provide floating point operation numerical representations which are entirely accurate can occur only if the gains through the chain to various converters, or just through the amplifiers of amplification steps where a single converter is used, are sufficiently accurate that the differences are accurate to one part in $2^B$. If 16-bit analog-to-digit converters are used, this means that there will be no gain errors greater than one part in 65,536, i.e., that the analog portions of the system will remain accurate to within 0.0015%. In general, analog system performance is not capable of such accuracy, certainly not over significant time durations or variations in temperature.

As an example of what can happen, consider a converter system using a chain of analog-to-digital converters and amplifiers, and that the gains in effect for each of a pair of adjacent converters in the chain are such that the gain difference between them is greater than the desired value. Assume the binary representation of the converter having the higher gain analog representation provided thereto receives an analog representation that just reaches the maximum value for which that converter can provide substantially equivalent binary representation. Then the next bit of increment in the succeeding analog signal value selected for a conversion should lead to taking the mantissa from the converter of the chain having an analog representation presented thereto for a conversion which has undergone less gain. However, this second converter's output will be too low relative to the first converter, the one having an analog representation of a higher gain presented thereto, because the gain difference between the two representations is too great. Thus, for a sequence of analog values selected for a conversion to floating point number equivalents which increase in amplitude, there would come to be a corresponding sequence of floating point numbers which actually decreased at a point in the sequence of such analog signal values presented for conversion, i.e., the converter system output would not be monotonic despite the monotonic increase in value sequence of analog signal values selected for conversion.

Alternatively, for a decreasing sequence of input analog signal values selected for a conversion in these circumstances, a series of floating point numbers provided in the conversion sequence would be decreasing and then reach a repeated value (a flat spot) through a portion of the sequence of input signal values. Since in a decreasing sequence, there would come a point when m bits of mantissa could no longer be obtained from the converter having an analog representation provided thereto which has undergone less gain, the attempt to select m bits of mantissa from the next converter having an analog representation of a higher gain would be unsuccessful. This next converter is still in an overrange condition since the gain provided to its analog representation is too high relative to that provided in the analog representation of the previous converter. Thus, the sequence of input analog signals selected for a conversion must continue to decrease for some time until this second converter provides a mantissa other than the one that it always provides in its overrange condition.

A similar set of problems occurs if the difference in gain undergone by analog representations provided at adjacent converters as in such an amplifier-converter chain is too small. For a sequence of decreasing analog signal values selected for conversion, the binary representations thereof are first obtained from the converter having a lower gain aplied to such representations. However, such a gain for these analog representations is not low enough and the representations are therefore too great in amplitude relative to the next converter in the chain which receives representations having a higher gain applied thereto. Thus, the first converter provides acceptable binary representations with full mantissas present even though the analog signal is small enough to cause such mantissas to also be present on the second converter. If the mantissas on the first converter are accepted, as the transition point is finally reached the second converter is already providing mantissas which are well below its maximum. A downward jump occurs as a result in the floating point number representations found for the declining sequence of analog signal input values selected for a conversion.

A comparable result occurs for an increasing sequence of input analog signal values selected for a conversion. The converter having analog representations of a higher gain provided thereto will continue to provide full m bit mantissas even after the adjacent converter having analog representations of lower gains presented thereto begins to provide such mantissas. As a result, if the converter having presented thereto analog representations of a higher gain been having its mantissas selected by scanning means 16, the transition point is finally reached so that mantissas must be selected from the converter having analog representations of a lower gain presented thereto. However, this latter converter will already have provided several acceptable m bit mantissas which were ignored by scanning means 16 so that at the transition point the mantissas provided will be above its minimum. There will be a sudden jump to the binary representations presently being provided by such converter, and this will be reflected in a sudden jump in the floating point number representations for the analog input values selected for a conversion.

These sudden jumps in floating point number representations, in each instance, mean that certain binary representations provided by one or the other of adjacent converters in a chain lead to certain floating point output numbers never being provided for any input analog signal values selected for conversion. Further, there will be jumps in floating points output numbers at the transition points where these binary representations are left out.

Such errors will cause serious problems in the accuracy of the floating point number representations which are obtained for the analog signal values from sensor 10 and preliminary amplifier 11 which are selected for conversion hereto. Furthermore, the earlier offset compensation procedure leads to a shaft in the range of binary representations which can be provided by a given analog-to-digital converter so that certain of the binary representations therefrom can also not be obtained for selections as the floating point number equivalent. This result from the offset compensation procedure has the same effect as a gain difference being too great between analog representations provided to adjacent converters in the chain but for one polarity of the input analog signal only. Thus, a procedure is necessary to compensate for these error sources.

Figure 9A:
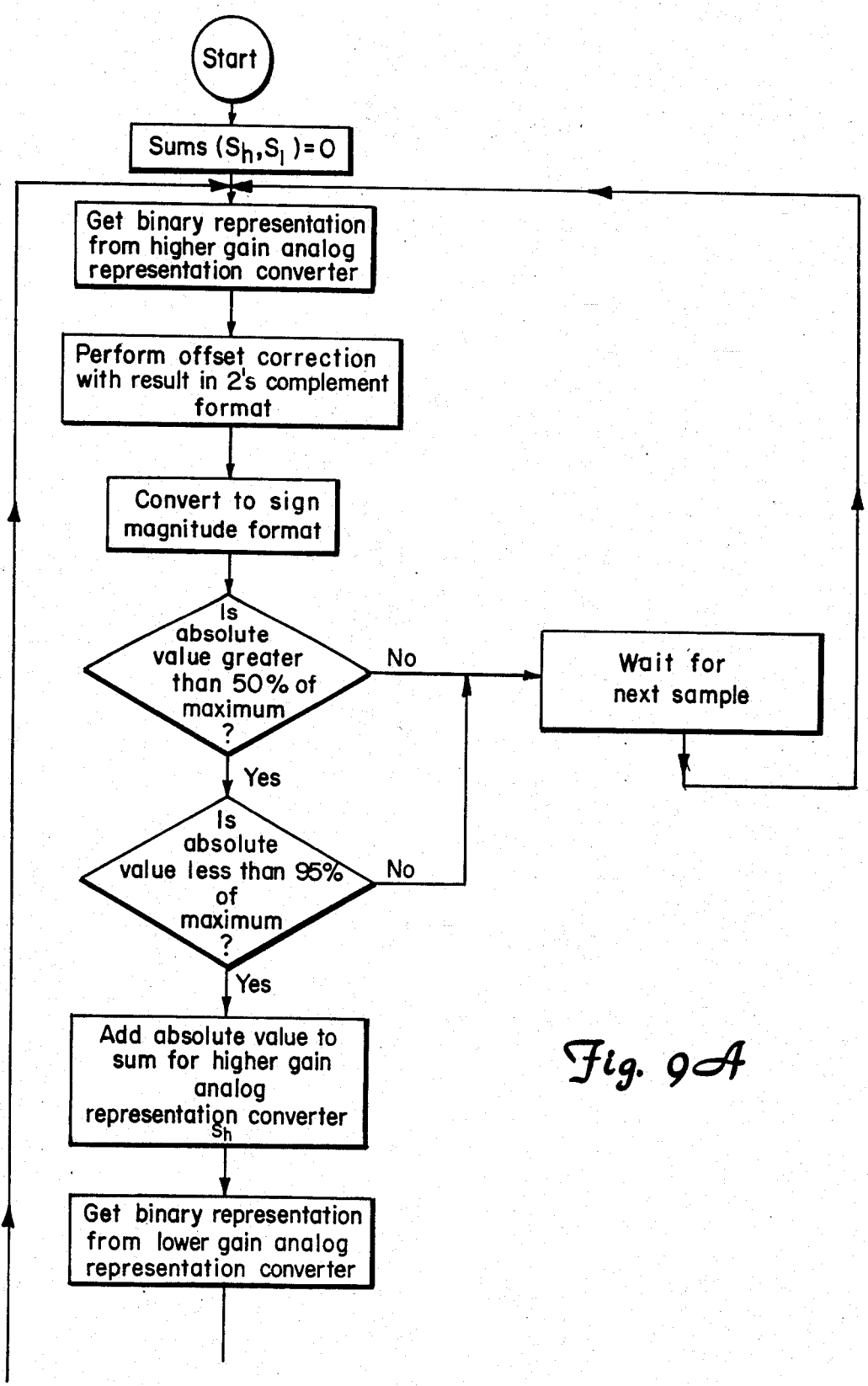
FIG. 9B is an illustration of a portion of the procedure followed in operating in the mode of FIG. 6.
Figure 9B:
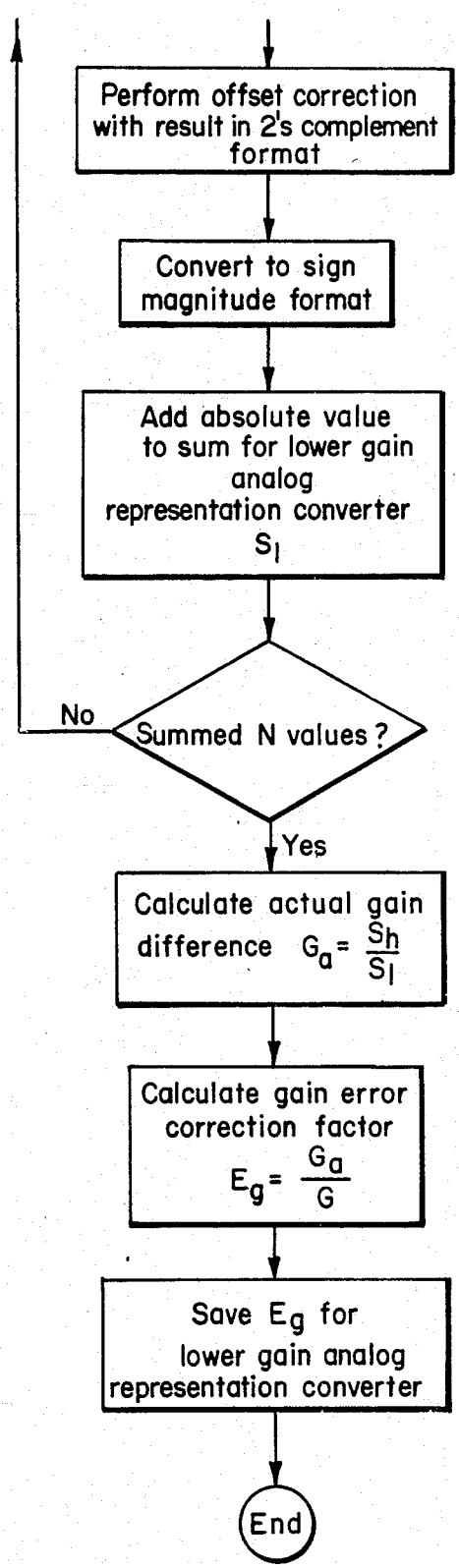

A procedure for compensating these gain errors, or effective gain errors, is based on determining the actual difference in gain between adjacent converters in a chain thereof, or between adjacent amplifiers where a signal converter is used, or between adjacent gain steps where a single converter and a varying gain amplifier is used. This procedure for a pair of adjacent converters, or adjacent amplifiers, or adjacent gain steps is shown in FIG. 9A and 9B for an example based on a pair of adjacent converters. One of these converters is designated the higher gain converter because it provides binary representations for analog representations having undergone a higher relative gain. The other converter is referred to as the lower gain converter because analog representations thereto have undergone a lower relative gain.

The procedure begins with clearing a couple of sum registers followed then by obtaining the first binary representation from the higher gain converter. This representation is compensated for its offset using the most recent average value Z found in the procedure of FIG. 8 which, as indicated there, gives a 2's complement format. This result is converted to a sign magnitude format. This result is then submitted to an eligibility test by ignoring the sign bit and obtaining the value of the remaining portion of the result. This value is subjected to a determination of whether it is greater than approximately 50 percent of, but less than approximately 95 percent of, the maximum value binary representation which the converter can provide based on its specified range of input analog signal values for which it can provide valid binary representations.

Requiring this eligibility test to be passed before the binary representation under consideration is used in the remainder of the procedure assures maximization of the significant number of bits provided in the binary representation from the lower gain converter. That is, there will be several bits of resolution in the output of the lower gain converter while still having a full m bit binary number representation on the output of the higher gain converter without it being in an overrange condition. Each of the binary representations from the higher gain converter which pass the eligibility test, of which there may be relatively few in actual sensor input data, has its absolute value (sign bit being ignored) added to the sum ($S_h$) of such binary representations obtained from the higher gain converter.

Figure 8:
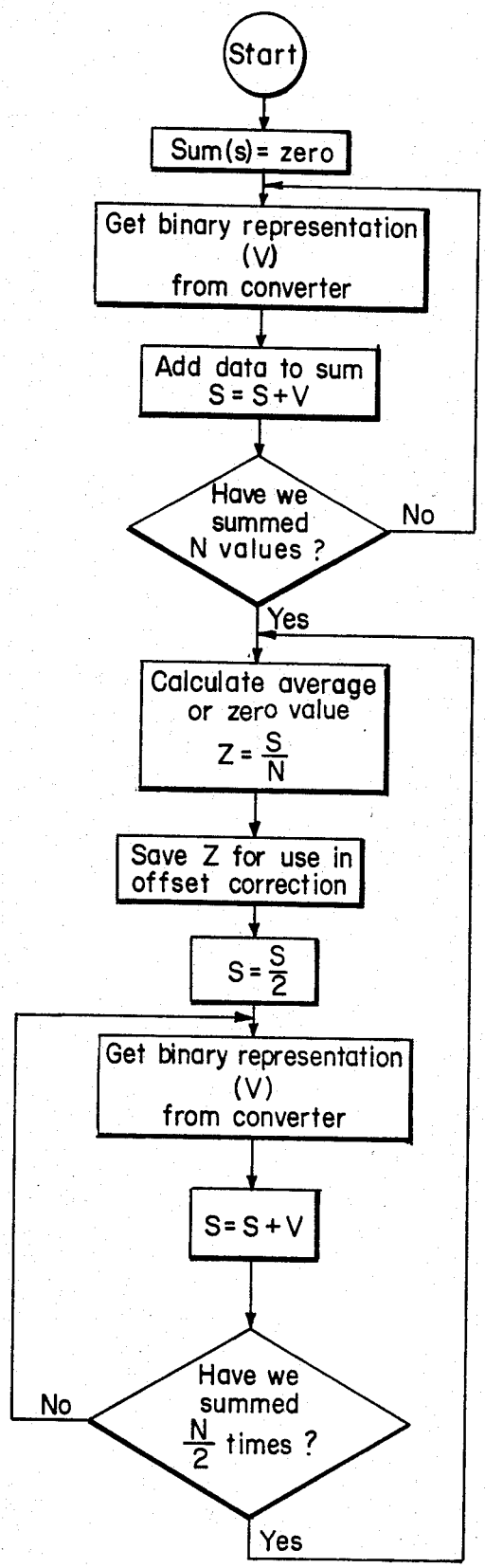
FIG. 8 is an illustration of a portion of the procedure followed in operating in the mode of FIG. 6, FIG. 9A, is an illustration of a portion of the procedure followed in operating in the mode of FIG. 6.

For each such binary representation accepted and included in the sum from the higher gain converter, (a) the binary representation concurrently present on the outputs of the lower gain converter is obtained, (b) its offset removed by using the most recent Z found for that converter from the procedure of FIG. 8, (c) the result converted to sign magnitude, and (d) the absolute value added to a similar sum ($S_l$) of such binary representations for the lower gain converter. Once a somewhat arbitrary number (n) of these binary representations have been included in such sums (based on the availability of sufficient data or convenience), the actual gain ratio ($G_a$) of (i) the gain which has effectively led to the binary representations from the higher gain converter, and (ii) the gain which has a lead to the binary representations from the lower gain converter, is found by dividing the sum $S_h$ by the sum $S_l$ or $G_a = S_h/S_l$. This actual gain ratio is based on n binary representations in each sum because there may be unwanted noise components contaminating some of the binary representations which will then to a significant extent be cancelled across n data points because of the random nature of such noise factors compared to the fixed nature of the actual gains.

From this result, the gain error correction factor ($E_g$) can be found between the actual gain ratio ($G_a$) and the desired gain ratio (G) which was selected to occur between the gains leading to the binary representations from each of the converters, or $E_g = G_a/G$. As indicated above, $G = 2^{[(B-m)+1]}$. $E_g$ will be a number slightly greater than, or less than, one depending on whether the actual gain ratio is too great or too little, respectively.

This error ratio in the gains would be measured in the best circumstances by use of a low frequency content calibration signal applied at the converter system input in place of a signal from sensor 10. Low frequency means frequencies which are low relative to the conversion rate of the individual analog-to-digital converters. Such a calibration signal would have to have an amplitude sufficiently great to allow gain measurements between the first couple of converters in the chain, or the first couple of amplifiers for use with a single converter, or the first couple of gain steps used in a varying gain amplifier with a single converter. In each of these instances, these would be the gains leading to the binary representations found for the two analog representations having undergone the least amount of gain to thereby assure that all the converters used in the chain provide valid conversions. The use of a sufficiently low frequency calibration signal is desirable to assure that the signal changes slowly enough to provide a significant number of binary representations for the highest gain converters in the chain necessary to reach the sample size required to give effect to the eligibility test.

However, it is possible to determine $G_a$ and $E_g$ from actual input signals from sensor 10 and preliminary amplifier 11 in normal use. The binary representations from the analog-to-digital converters will be reviewed at desirable times to find those values which meet the eligibility test, and which are then added to the sums of absolute values $S_h$ and $S_l$ needed to calculate the actual gain ratio. After a sufficient number values have been added to these sums, the gain error actual ratio and the correction factor can be found and saved for use until new sums $S_h$ and $S_l$ are subsequently found to provide updated gain corrections. Typically, gain changes will not happen nearly as rapidly as will offset value changes and, therefore, an update in the correction factors need not be found nearly as often as updates of the average Z for offset correction must be found.

Upon finding the correction factor $E_g$, each binary representation provided by the lower gain converter is multiplied by this correction factor to compensate for any gain errors or any effective gain errors. Such compensation means there will be few or no jumps or monotonicity problems at the transition points where input analog signal values are changing sufficiently to require full m bit mantissas to be taken from another analog-to-digital converter than had just been taken from an adjacent converter.

If the procedure of FIG. 9 is first applied to the highest gain converter in the entire chain and the converter next lower in gain therefrom, the procedure can again be repeated up the chain for each pair of converters such that the highest gain converter will be the standard for the entire chain. That is, every converter's gain correction factor will in the end be based on its relationship to the gain of the highest gain converter in the chain. This will be true since each converter closer to that highest gain converter has its gain made relative to the highest gain converter.

The output of each lower gain converter with respect to an adjacent converter is multiplied by its gain compensation factor with respect to the next higher gain converter. In a system with three or more converters, the gain compensation for the third lowest gain converter, or even lower gain converters, is based on the gain correction factor between it and its next higher gain converter and then on all of the other similar gain correction factors found for each of the other converter pairs through the chain to the converter having the greatest gain. This result is shown in FIG. 10 where the correction factor for the converter having analog representations provided thereto having undergone the grestest gain is shown to be exactly one since it is the chosen gain standard.

As indicated above, and shown in FIG. 7, the offset correction procedure leads to a narrowing in the binary representations available from an analog-to-digital converter which, in turn, narrows the range of analog signal values which can be converted to substantially equivalent binary representations. This leaves certain binary representations entirely unavailable and can cause jumps in the floating point number representations for a sequence of analog input values selected for a conversion. Also, as already indicated, this appears effectively like a gain error, and so compensation therefor can also be accommodated in the procedure of FIG. 9. First, the maximum value ever expected to occur for any offsets encountered at the output of each analog-to-digital converter in a normally operating floating point conversion system must be estimated. A typical value which should be sufficient for carefully designed circuits in the analog portion of the converter system would be five percent (5%) which will hereafter be used as an example. In other words, each converter is estimated to always be able to generate substantially equivalent binary representations for analog representations provided thereto if the analog representations lead to binary representations which are of any value up to ninety-five percent (95%) of the maximum range of binary representations after offset compensation, as analog input signals at the converter input in the converter specified conversion capability range. Such binary representations are then qualified as having met this qualification test imposed by scanning means 16. They must also meet the earlier set out eligibility test to be included in the data for finding actual gain differences.

The estimate having been made for the maximum offset value, the procedure is based on using just these qualified binary representations to provide full m bit mantissas. Scanning means 16 will not accept binary representations from any of the converters if that binary representation after offset compensation is greater than ninety-five percent (95%) of the full range of binary representations available from that converter, i.e. an unqualified representation. Instead, the mantissa will be obtained from the adjacent converter provided with analog representations having undergone a lower gain to thereby avoid the binary representation omissions at one end of the range thereof due to the offset compensation procedure. In these circumstances, a 12-bit converter which would give a result ordinarily in the range of $-2047$ to $+2047$ if there were no offset. Under the just set out procedure, only values within the range of $-1945$ to $+1945$ will be accepted, meaning that an offset within the range of $-102$ to $+102$ will not be given effect by scanning means 16 in the range of binary representations from the converters from which means 16 obtains m bit mantissas for floating point number equivalents. In effect, the specified ranges of the converters for operating on analog signals validly are narrowed from those determined by the conversion capability of each converter to ranges determined by what is acceptable to scanning means 16 for converter system purposes.

This, of course would mean that the binary representation provided by the adjacent lower gain converter would often not have a full set of m bits for a mantissa if no other procedural changes were made. However, this is where the gain correction procedure of FIG. 9 is used to assure that the lower gain input adjacent converter does have such a mantissa.

One way of doing so comes about because of the occurrence of a multiplication result in the FIG. 9 procedure. The gain compensation factor $E_g$ determined in the procedure of FIG. 9 is typically going to be a number of a value close to 1.000. If $E_g$ is of value something like 0.9884, then multiplying this factor times a binary representation of the lower gain input adjacent converter will result in lower significant bits being generated to the right of the least significant bit in the original binary representation. These bits represent lesser values than what the lower significant bits represented in the original binary representation obtained from this converter prior to multiplication by the error correction factor.

Furthermore, these bits generated by the multipication procedure assure there will always be bits generated below the most significant bits which are present in the lower gain input adjacent converter sufficient to provide m bits if these are retained by scanning means 16 after multiplication. This presents the possibility of retaining the most significant of these added lower bits so the lower gain input adjacent converter can be used as though it were a B+1 bit converter. This extra bit can be used to form a full m bit mantissa from the converter for those input signal levels which led to representations which were skipped over in the higher gain input adjacent converter in the decision to use only representations which were less than ninety-five percent (95%) of the full scale of that converter.

An alternative manner of assuring m bits being available from the lower gain input adjacent converter would be to decrease the actual gain differences between (a) adjacent analog-to-digital converters, or between (b) adjacent amplifiers where one converter is used, or between (c) adjacent gain steps where one converter is used with a varying gain amplifier, from the value otherwise desired therefor, $G=2^{[(B-m)+1]}$. The decrease in gain difference would be by the amount estimated as the maximum offset above of K% of the converter specified range where, for example, K=5. If that were again five percent (5%) of the full specified conversion range of each analog-to-digital converter in which substantially equivalent binary representations can be provided for analog input signals thereto, the desired gain ratio between adjacent converters, amplifiers or gain steps will be reduced by five percent (5%). Thus, the error correction factor would still be $E_g = -G_a/G$ but $G_a$ would be about 5% smaller than previously because the various amplifier gains would be adjusted to reduce the differences by 5%. Thus, as scanning means 16 refuses to accept binary representations from an analog-to-digital converter which are in excess of ninety-five percent (95%) of the specified conversion capability range, i.e. unqualified representations, the lower gain input adjacent converter will be providing full m bit mantissas, even before gain compensation, because of the increase in the gain factor applied to the analog representations at the input of this converter resulting from the lowering of the gain difference between the analog representations supplied to each. Scanning means 16 must proceed, of course, upon finding an unqualified binary representation to check the representation from the next lower gain input converter to determine whether it is qualified. Such successive checking, or scanning, continues until a qualified representation is found.

Since both the offset compensation procedure and the gain error compensation procedure are based on use of actual analog signals from sensor 10 (and from preliminary amplifier and filter 11 if used) the storage of (a) all of the binary representations from any of the analog-to-digital converters in a chain thereof as in FIGS. 2A and 3 for each input analog signal value selected for conversion to a floating point number, or of (b) all of the binary representations provided by a single converter from all of the amplifiers for each input analog signal value selected for conversion where a single converter and a chain of amplifiers is used as in FIGS. 4A and 4B, or of (c) all of the binary representations provided by a single converter from each of a series of gain steps in a gain varying amplifier for each input analog signal value selected for conversion where a single converter and a varying gain amplifier are used as in FIG. 5, permits the selection of a mantissa and the exponent for each selected analog value from compensated data at a later time. That is, where there is no need to provide a real-time floating point number representation for each input analog signal value from sensor 10 and amplifier 11 selected for conversion at the time such analog values are available the floating point equivalent can be provided later. The results from the analog-to-digital converters, or single converter, can be all stored at the time the analog sensor signal is available, and then later retrived and supplied to a scanning means to provide the offset compensation, the gain error compensation, and the mantissa selection and exponent determination.

Figure 11:
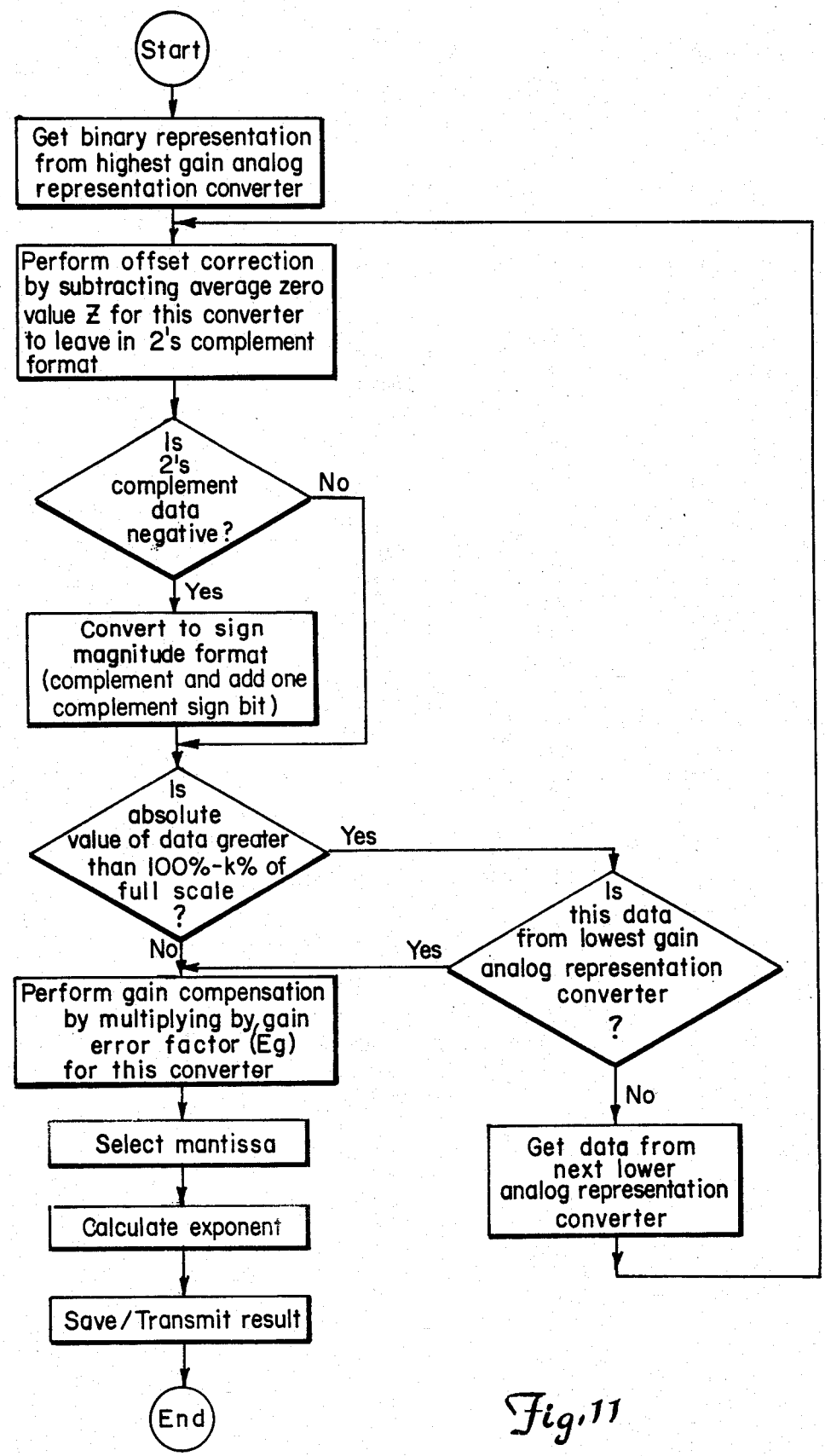
FIG. 11 is an illustration of the overall procedure followed in operating in the mode of FIG. 6.

FIG. 11 shows the operating procedure for the converter systems of the present application, specifically for the example of a multiple analog-to-digital converter chain. Slight adaptations in the flow-chart labeling could permit it to be applied to converter systems having a single converter with either a multiple amplifier chain or a varying gain amplifier. For each analog signal value from sensor 10 and amplifier 11 selected for conversion to a floating point number representation equivalent, the steps shown in FIG. 11 are undertaken.

Scanning means 16, as a computer system, starts by accepting all converter binary representations, proceeding to choose as a first binary representation to be compensated and tested, the one from the analog-to-digital converter having a corresponding analog representation of the input analog signal value selected for a conversion which has undergone the highest gain. Scanning means 16 may provide some preliminary modifications to this binary representation to adapt it for operations therein, but offset correction will be the first major modification thereto. The offset correction applicable to that converter is made by subtracting the corresponding average Z value from this binary representation (or modified representation) which provides the compensated value representation in a 2's complement format. As indicated above, this is changed to a sign magnitude format for clarity, but in practice need not be.

This offset compensated binary representation in signal and magnitude format is then subjected to a qualification test to determine whether it has an absolute value which is greater than ninety-five percent (95%) of the specified conversion capability range of that converter, i.e. if it is outside the specified acceptance range. If it is not, that offset compensated binary representation is sent on as the chosen basis for providing a floating point number representation for the input analog signal value, first to be gain error compensated and then to provide a mantissa and exponent, ending the procedure.

If the offset compensated binary representation is greater than the specified acceptance range, scanning means 16 proceeds with the compensating and testing of the next binary representation, which is the one provided by the converter to which analog representations are provided, having undergone the next greatest amount of gain. This continues until either an offset compensated binary representation is found which is qualified to be the basis for a floating point number representation, which is then gain error compensated and has a mantissa and exponent selected therefrom to terminate the procedure, or until the binary representation is considered from the converter having the lowest gain analog representation supplied thereto. The binary representation from this last converter is always sent for gain error compensation and mantissa and exponent selection to terminate the procedure. Again, the scanning process to determine the floating point number representations can be postponed to a more convenient time if all of the binary representations from all of the analog-to-digital converters for each analog signal value to be converted are stored for later retrieval and scanning.

The results of this procedure can be seen in the example of FIG. 6 which was presented above to the extent of providing offset compensation through subtracting an average zero value to provide a binary representation with respect to zero compensated for offset. This result is in the 2's complement format and is then converted to sign magitude format. For positive numbers no change is required, but for negative numbers (indicated by the bit in the farmost left position) the numbers must be complemented and one added to the total followed by complementing the sign bit.

Each offset compensated value in signal magnitude format for which a higher gain input converter does not provide a binary representation meeting the qualification test, is itself given a qualification test to determine whether it, and so its corresponding analog representation, is within the specified acceptance range. Converter 12" is shown in an overrange condition in FIG. 6, but converter 12' is shown to have passed the qualification test. As a result, no portion of the procedure after acceptance by scanning means 16 of the binary representation from converter 12 is applied to the binary representation. Acceptance need not necessarily mean scanning means 16 stores the binary representation from a converter in some storage register, though it could mean that, but that the digit signals at the converter output providing the binary representation are electrically present on the inputs 17 of scanning means 16.

Since the binary representation provided at the outputs of converter 12' has been found to pass the qualification test, that offset compensated binary representation is sent on to be multiplied by the gain error compensation factor for converter 12'. Thereafter, the mantissa is located as the first significant bit that is a one after the sign bit, and that bit and the next six bits thereafter to the right are selected to form a 8-bit mantissa, including the sign bit. Further, the unused bit positions to the right of the mantissa within converter 12' are counted to be 4 in number. To this must be added the gain of amplifier 22 in powers of 2 or the gain due the unused bit positions of converter 12", i.e. leading to an exponent of 9. This value of 9, then, is the power to which the base two must be raised to provide a scaling factor by which the mantissa must be multiplied to obtain a value substantially equivalent to that of the analog signal value for which the floating point representation has been provided.

An alternative to the procedure shown in FIG. 11 can be used to increase the rate of making floating point number conversions. Rather than choosing the first binary representation to be compensated and tested as the one from the highest input gain converter, scanning means 16 would choose the binary representation from the converter which provided the last binary representation which was the basis for the preceding floating point number representation. Such testing would now have to be expanded to determine if the representation was too small as well as too large. Because the differences between successive values selected for conversion from the input analog signal are likely to be relatively close in value, and because each converter covers a significant portion of the analog signal range, the chances are good that the succeeding binary representation from that converter would be the one converted to the next floating point number representation. This omission of testing and compensating binary representations from higher input gain converters will save the time otherwise requried for such testing and compensation.

Figure 12:
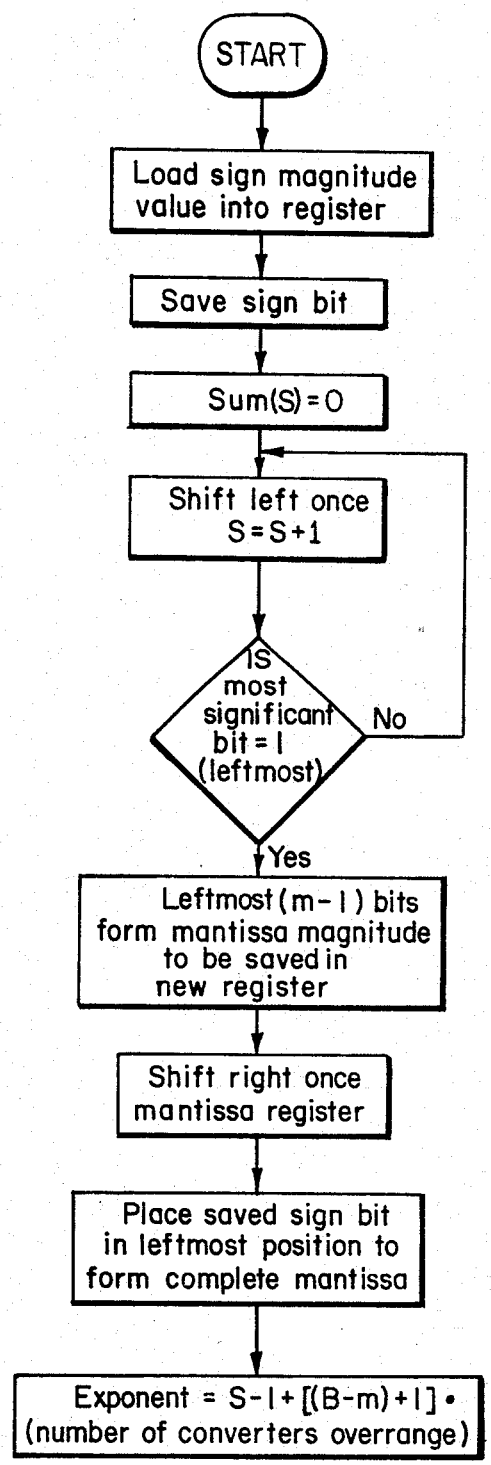
FIG. 12 is an illustration of a portion of the procedure followed in operating in the mode of FIG. 6.

FIG. 12 shows a procedure for selecting the mantissa and calculating the exponent required in reaching the floating point number representation shown in FIG. 6. The procedure set out in FIG. 12 shows in more detail the procedure summarized in the two blocks shown in FIG. 11 after the block indicating that gain error compensation has been provided to that offset compensated binary representation passing the qualification test to thereby be chosen as the basis for providing the floating point number representation of the input analog signal value being converted.

The procedure starts with loading the sign magnitude value into a register and saving therefrom the sign bit, i.e. the bit farthest to the left. A sum register (S) for keeping account of shifts made in the sign magnitude value register is set equal to zero. A first shift left is provided in the sign magnitude value register and the shift count register is incremented by one. The result is checked to see if the most significant bit thereof has a logic value of one. If not, the shift sequence and the incrementing of the shift count register is done again and the same test applied. This continues until the most significant bit in the sign magnitude value register after shifting has a logic value of one.

This occurrence designates the leftmost $m-1$ bits as the mantissa (except for the sign bit) which is saved in the new mantissa register. This mantissa register undergoes a single bit right shift to accept the sign bit in its leftmost position to form a complete mantissa. The exponent is determined from the shift count increment register count less one plus the gains in powers of 2 of each of the amplifiers in the chain from the converter providing the binary representation serving as the basis for the floating point number representation to the highest gain input converter. Alternatively, the exponent is the shift count increment register count less one plus all the unused mantissa positions in higher gain input converters or $[(B-m)+1]$ times the number of converters in overrange.

The converter systems of FIGS. 1, 2A, 3, 4A, 4B and 5, and variants thereof, can provide very high sampling rates of those analog signals which are provided by sensor 10. This is because the only limits on the sampling rate are the times taken by the converters to provide a binary representation of the analog representations provided thereto, and the transfer times from the converter outputs to memory. Since scanning to find the actual floating point number representation from the stored binary representations can be done at a later, more convenient time, scanning time can be eliminated insofar as the sampling rates are concerned.

Furthermore, very accurate results are provided for each input analog signal value selected for conversion to a floating point number representation. If all of the binary representations are taken from a single analog-to-digital converter, the overall accuracy in the gain steps will depend only on the linearity of the converter itself, which will be in the range of thousandths of a percent. if a chain of converters is used, accuracy is limited by the gain steps from one converter to the other at transition points which can be made very accurate by the gain error compensation procedure described above, being capable of reducing gain errors to better then one part in $2^{m-1}$.

Although the present invention has been described with reference to preferred embodiments, workers skilled in the art will recognize that changes may be made in form and detail without departing from the spirit and scope of the invention.

What is claimed is:

1. An analog-to-digital converter system for converting selected analog signal values from an analog signal provided at a converter system input to a digital representation of a substantially equivalent value, said digital representation being formed by a plurality of representation signals having a first subset thereof containing representation signal values representing a scaled number mantissa for said substantially equivalent value and a second subset thereof containing representation signal values representing that power to which a base value must be raised to give a scaling value by which said mantissa must be multiplied to provide said substantially equivalent value, said converter system comprising:

a receiving means electrically connected to said converter system input and having an output at which analog representations of said selected analog signal values are provided;

a first analog-to-digital converter means having an input electrically connected to said receiving means output to receive said analog representations of said selected analog signal values and having a plurality of outputs, said first analog-to-digital converter means being capable of receiving said analog representations of said selected analog signal values and being capable of providing at each of said first converter means outputs a digit signal of a selected value to thereby provide a first plurality of digit signals such that those values taken by each of said digit signals in differing combinations permit said first plurality of digit signals to represent analog signal values provided at said first converter means input, which have amplitudes within specified amplitude ranges, by providing an alternative initial conversion digit value combination for each of said such specified amplitude range analog signal values, but with at least some analog signal values outside said specified amplitude range being represented by initial conversion digit value combinations substantially identical to one another; and a scanning means having inputs electrically connected to said first converter means outputs to receive said first plurality of digit signals, said scanning means being capable of receiving a said conversion digit value combination from said first plurality of digit signals for that said analog representation provided for each said selected analog signal value, and of providing selected modifications thereto based on a plurality of conversion digit value combinations previously received to thereby form a corresponding modified conversion digit value combination selectively differing from its said initial conversion digit value combination, and being further capable of selecting a first fraction of said digit values from a said modified conversion digit value combination based on at least one said digit value in said first fraction of digit values from that said modified conversion digit value combination, and is further capable of selecting a second fraction of said digit values from said modified conversion digit value combination which excludes any of said first fraction of said digit values, said scanning means also being capable of providing said plurality of representation signals with said first subset of representation signal values based on said first fraction of digit values, and said second subset of representation signal values based on said second fraction of digit values.

2. The apparatus of claim 1 which further comprises a plurality of analog-to-digital converter means, including said first analog-to-digital converter means and a second analog-to-digital converter means, each having an input for receiving analog signal values and each having a plurality of outputs including said first converter means input and outputs and said second converer means input and outputs, each of said analog-to-digital converter means being capable of providing at each one of its corresponding said converter means outputs a digit signal of a selected value to thereby provide a corresponding plurality of digit signals for each one of said plurality of analog-to-digital converter means such that those values taken by each of said digit signals in differing combinations in a said corresponding plurality of digit signals permits that said plurality of digit signals to represent analog signal values provided at its corresponding said converter means input which have amplitudes within specified amplitude ranges, by providing an alternative initial conversion digit value combination for each of such specified amplitude range analog signal values, but with at least some analog signal outside said specified amplitude ranges being represented by initial conversion digit value combinations substantially identical to one another, there being a second plurality of digit signals at said second plurality of outputs of said second analog-to-digital converter means, and further comprising a plurality of analog signal amplifiers each having an input and an output, including a first analog signal amplifier having a first amplifier input and a first amplifier output, said first amplifier input being electrically connected to said first analog-to-digital converter means input and said first amplifier output being electrically connected to said second analog-to-digital converter means input, said scanning means also being electrically connected to said second converter means outputs to receive said second plurality of digital signals, said scanning means being capable of receiving an initial conversion digit value combination from both of said first and second pluralities of digit signals for that said analog representation provided for each said selected analog signal value and of providing selected modifications to either based on a plurality of conversion digit value combinations previously received to thereby form a corresponding modified conversion digit value combination, and being further capable of selecting a first fraction of digit values from a said modified conversion digit value combination from either of said first and second pluralities of digit signals based on at least one said digit value in said first fraction of digit values from that said modified conversion digit value combination, said scanning means being further capable of selecting a second fraction of said digit values from that said modified conversion digit value combination from which said first fraction of said digit values is selected excluding any of said first fraction of said digit values and providing a count of said second fraction of digit values so selected, said second subset of representation signal values being based on said second fraction of digit values and, selectively also on any of said plurality of analog-to-digital converter means which have a said analog representation of a said selected analog signal value provided thereto of an amplitude beyond said specified amplitude ranges.

3. The apparatus of claim 1 which further comprises a plurality of analog-to-digital converter means, including said first analog-to-digital converter means and a second analog-to-digital converter means, each having an input for receiving analog signal values and each having a plurality of outputs including said first converter means input and outputs and said second converter means input and outputs, each of said analog-to-digital converter means being capable of providing at each one of its corresponding said converter means outputs a digit signal of a selected value to thereby provide a corresponding plurality of digit signals for each of said plurality of analog-to-digital converter means such that those values taken by each of said digit signals in differing combinations in a said corresponding plurality of digital signals permits that said splurality of digit signals to represent analog signal values provided at its corresponding said converter means input which have amplitudes within specified amplitude ranges, by providing an alternative initial conversion digit value combination for each of such specified amplitude range analog signal values, but with at least some analog signal values outside said specified amplitude ranges being represented by initial conversion digit value combinations substantially identical to one another, there being a second plurality of digit signals at said second plurality of outputs of said second analog-to-digital converter means, and further comprising a plurality of analog signal amplifiers each having an input and an output, including a first analog signal amplifier having a first ampifier input and a first amplifier output, said first amplifier input being electrically connected to said receiving means output and said first amplifier output being electrically connected to said second analog-to-digital converter means input, said scanning means also being electrically connected to said second converter means outputs to receive said second plurality of digit signals, said scanning means being capable of receiving an initial conversion digit value combination from both of said first and second pluralities of digit signals for that said analog representation provided for each said selected analog signal value and of providing selected modifications to either based on a plurality of conversion digit value combinations previously received to thereby form a corresponding modified conversion digit value combination, and being further capable of selecting a first fraction of digit values from a said modified conversion digit value combination from either of said first and second pluralities of digit signals based on at least one said digit value in said first fraction of digit values from that said modified conversion digit value combination, said scanning means being further capable of selecting a second fraction of said digit values from that said modified conversion digit value combination from which said first fraction of said digit values is selected excluding any of said first fraction of said digit values and providing a count of said second fraction of digit values so selected, said second subset of representation signal values being based on said second fraction of digit values and, selectively, also on substantially any of said plurality of analog-to-digital converter means which have a said analog representation of a said selected analog signal value provided thereto of an amplitude beyond said specified amplitude ranges.

4. The apparatus of claim 1 wherein said receiving means further comprises a first analog signal amplifier having an input and an output with said first amplifier being capable of providing at said first amplifier output a signal substantially similar to a signal provided at said first amplifier input but of a selected magnitude to thereby provide a gain ratio therebetween, said first amplifier input being electrically connected to said converter system input and said first amplifier output being electrically connected to said receiving means output.

5. The apparatus of claim 1 wherein said receiving means further comprises a plurality of analog signal amplifiers each having an input and an output, including a first analog signal amplifier having a first amplifier input and a first amplifier output, said first amplifier input being electrically connected to said converter system input, and wherein said receiving means further comprises a switching means having a plurality of input terminals including first and second switch input terminals and an output terminal such that any of said switch input terminals can be selectively and alternatively electrically connected to said switch output terminal, said switch first input terminal being electrically connected to said converter system input, said switch second input terminal being electrically connected to said first amplifier output, and said switch output terminal being electrically connected to said receiving means output, said switch sequentially electrically connecting each of said first and second switch inputs to said switch output for each said selected analog signal value provided to said converter system input to thereby provide said analog representations thereof, said scanning means being capable of receiving an initial conversion digit value combination from said plurality of digit signals for each such switch connection and being capable of forming a corresponding modified conversion digit value combination from each said initial conversion digit value combination so received based on a plurality of conversion digit value combinations previously received, and being further capable of selecting said first and second fractions of digit values from any of such modified conversion digit combinations, said second subset of representation signal values being based on said second fraction of digit values and, selectively, also on substantially those gain ratios of any of said plurality of analog signal amplifiers which provide a said analog representation of said selected analog signal value to said first converter means input of an amplitude beyond said specified amplifier ranges.

6. The apparatus of claim 1 wherein said selected modification of a said initial conversion digit value combination is to change digit values thereof to compensate said initial conversion digit value combination for any effects contained therein introduced by said converter system in forming and converting said analog representations of said selected analog signal values.

7. The apparatus of claim 1 wherein said scanning means comprises a computer means.

8. The apparatus of claim 1 wherein each resulting said digital representation is stored in a storage means.

9. The apparatus of claim 1 wherein said receiving means output is directly electrically connected to said converter system input continuously.

10. The apparatus of claim 1 wherein determination of those of said digit values which are included in said first fraction of digit values is based on a relationship of each to that said digit value which is of greatest numerical representational value in said modified conversion digit value combination.

11. The apparatus of claim 1 wherein said scanning means is capable of providing a count of those digit values included in said second fraction of digit values, and wherein said second subset of representation signal values, insofar as being based on said second fraction of digit values, is based on said count.

12. The apparatus of claim 1 wherein said specified amplitude ranges exclude a fraction of those amplitude ranges in which said first analog-to-digital converter means is capable of representing analog signal values provided thereto in providing alternative initial conversion digit value combinations therefor, and said excluded fraction is greater than that fraction of those same amplitude ranges which would be needed for represent offsets introduced into said conversion digit value combinations by said converter system.

13. The apparatus of claim 2 wherein said plurality of analog-to-digital converter means includes a third analog-to-digital converter means with an input and outputs and with a third plurality of digit signals being provided at said third converter means outputs, and which apparatus further comprises a second along signal amplifier having an input and an output with said second amplifier being capable of providing at said second amplifier output a signal substantially similar to a signal provided at said second amplifier input but of a selected magnitude to provide a gain ratio therebetween, said second amplifier input being electrically connected to said second analog-to-digital converter means input and said second amplifier output being electrically connected to said third analog-to-digital converter means input, said scanning means also being electrically connected to said third converter means outputs to receive said third plurality of digit signals, said scanning means being capable of receiving an initial conversion digit value combination from each of said first, second and third pluralities of digit signals for that said analog representation of each said selected analog signal value and providing selected modifications to any of them to thereby form a corresponding modified conversion digit value combination, and being capable of selecting a first fraction of digit values from a said modified conversion digit value combination from any of said first, second and third pluralities of digit signals based on at least one said digit value in said first fraction of digit values from that said modified conversion digit value combination, said scanning means being further capable of selecting a second fraction of said digit values from that said modified conversion digit value combination from which said first fraction of said digit values is selected excluding any of said first fraction of said digit values and providing a count of said second fraction of said digit values so selected.

14. The apparatus of claim 2 wherein determination of those of said digit values which are included in said first fraction of digit values is based on a relationship of each to that said digit value which is of greatest numerical representational value in that said modified conversion digit value combination which has a selected number of digit values with said a relationship, and where that said modified conversion digit value combination is due to that corresponding one of said first and second analog-to-digital converter means having an analog signal within its said specified amplitude ranges present at its input to be represented by that said initial conversion digit value combination on which this said modified conversion digit value combination is based.

15. The apparatus of claim 3 wherein said plurality of analog-to-digital converter means includes a third analog-to-digital converter means with an input and outputs and with a third plurality of digit signals being provided at said third converter means outputs, and which apparatus further comprises a second analog signal amplifier having an input and an output with said second amplifier being capable of providing at said second amplifier output a signal substantially similar to a signal provided at second analog amplifier input but of a selected magnitude to provide a gain ratio therebetween, said second amplifier input being electrically connected to said receiving means output and said second amplifier output being electrically connected to said third analog-to-digital converter means input, said scanning means also being electrically connected to said third converter means outputs to receive said third plurality of digit signals, said scanning means being capable of receiving an initial conversion digit value combination from each of said first, second and third pluralities of digit signals for that said analog representation of each said selected analog signal value and providing selected modifications to any of them to thereby form a corresponding modified conversion digit value combination, and being capable of selecting a first fraction of digit values from a said modified conversion digit value combination from any of said first, second and third pluralities of digit signals based on at least one said digit value in said first fraction of digit values from that said modified conversion digit value combination, said scanning means being further capable of selecting a second fraction of said digit values from that said modified conversion digit value combination from which said first fraction of said digit values is selected excluding any of said first fraction of said digit values and providing a count of said second fraction of said digit values so selected.

16. The apparatus of claim 3 wherein determination of those of said digit values which are included in said first fraction of digit values is based on a relationship of each to that said digit value which is of greatest numerical representational value in that said modified conversion digit value combination which has a selected number of digit values with such a relationship, and where that said modified conversion digit value combination is due to that corresponding one of said first and second analog-to-digital converter means having an analog signal within its said specified amplitude ranges present at its input to be represented by that said initial conversion digit value combination on which this said modified conversion digit value combination is based.

17. The apparatus of claim 4 wherein said first analog signal amplifier is capable of having analog signals on said first analog signal amplifier output selectively increased in magnitude in a series of gain ratio change steps to provide a series of differing gain ratios for each said selected analog signal value to thereby provide a said analog representation thereof for each said gain ratio, and said scanning means is capable of receiving an initial conversion digit value combination from said first plurality of digit signals for each of said ratios for each said selected analog signal value and of providing selected modifications thereto to thereby form a corresponding modified conversion digit value combination, and further being capable of selecting said first and second fractions of digit values from any of such modified conversion digit value combinations, said second subset of representation signal values being based on said second fraction of digit values and, selectively, also substantially on those gain ratios which provide a said analog representation of a selected analog signal value to said first converter means input of an amplitude beyond said specified amplitude ranges.

18. The apparatus of claim 5 wherein said plurality of analog signal amplifiers includes a second analog signal amplifier having an input and an output, said second amplifier input being electrically connected to said first amplifier output, and said second amplifier output being electrically connected to a third switch input terminal with said third switch input being electrically connected to said switch output in sequence with said first and second switch inputs.

19. The apparatus of claim 5 wherein said plurality of analog signal amplifiers includes a second analog signal amplifier having an input and an output, said second amplifier input being electrically connected to said converter system input, and said second amplifier output being electrically connected to a third switch input terminal with said third switch input being electrically connected to said switch output in sequence with said first and second switch inputs.

20. The apparatus of claim 5 wherein determination of those of said digit values which are included in said first fraction of digit values is based on a relationship of each to that said digit value which is of greatest numerical representation value in that said modified conversion digit value combination which has a selected number of digit values with such a relationship, and where that said modified conversion digit value combination is due to said first analog-to-digital converter means while having an analog signal within its said specified amplitude ranges present at its input to be represented by that said initial conversion digit value combination on which this said modified conversion digit value combination is based.

21. The apparatus of claim 6 wherein said modified conversion digit value combination comprises substantially its corresponding said initial conversion digit value combination with offset values introduced therein by said converter system removed.

22. The apparatus of claim 6 wherein said modified conversion digit value combination comprises substantially its corresponding said initial conversion digit value combination with gain error values introduced therein by said converter system removed.

23. The apparatus of claim 6 wherein said specified amplitude ranges exclude a fraction of those amplitude ranges in which said first analog-to-digital converter means is capable of representing analog signal values provided thereto through providing alternative initial conversion digit value combinations therefor, and said excluded fraction is greater than that fraction of those sample amplitude ranges which would be needed to represent offsets introduced into said conversion digit value combinations by said converter system.

24. The apparatus of claim 10 wherein said specified amplitude ranges exclude a fraction of those amplitude ranges in which said first analog-to-digital converter means is capable of representing analog signal values provided thereto through providing alternative initial conversion digit value combinations therefor, and said excluded fraction is greater than that fraction of those same amplitude ranges which would be needed to represent offsets introduced into said conversion digit value combinations by said converter system.

25. The apparatus of claim 13 wherein determination of those of said digit values which are included in said first fraction of digit values is based on a relationship of each to that said digit value which is of greatest numerical representation value in that said modified conversion digit value combination which has a selected number of digit values with such a relationship, and where that said modified conversion digit value combination is due to that corresponding one of said first, second and third analog-to-digital converter means having an analog signal within its said specified amplitude ranges present at its input to be represented by the said initial conversion digit value combination on which this said modified conversion digit value combination is based.

26. The apparatus of claim 14 wherein said specified amplitude ranges exclude a fraction of those amplitude ranges in which said first and second analog-to-digital converter means are capable of representing analog signal values provided thereto in providing alternative initial conversion digit value combinations therefor, and said excluded fraction is greater than that fraction of those same amplitude ranges which would be needed to represent offsets introduced into said conversion digit value combinations by said converter system.

27. The apparatus of claim 15 wherein determination of those of said digit values which are included in said first fraction of digit values is based on a relationship of each to that said digit value which is of greatest numerical representation value in that said modified conversion digit value combination which has a selected number of digit values with such a relationship, and where that said modified conversion digit value combination is due to that corresponding one of said first, second and third analog-to-digital converter means having an analog signal within its said specified amplitude ranges present at its input to be represented by that said conversion digit value combination on which this said modified conversion digit value combination is based.

28. The apparatus of claim 16 wherein said specified amplitude ranges exclude a fraction of those amplitude ranges in which said first and second analog-to-digital converter means are capable of representing analog signal values provided thereto through providing alternative initial conversion digit value combinations therefor, and said excluded fraction is greater than that fraction of those same amplitude ranges which would be needed to represent offsets introduced into said conversion digit value combinations by said converter system.

29. The apparatus of claim 17 wherein determination of those of said digit values which are included in said first fraction of digit values is based on a relationship of each to that said digit value which is of greatest numerical representational value in that said modified conversion digit value combination which has a selected number of digit values with such a relationship, and where that said modified conversion digit value combination is due to said first analog-to-digital converter means while having an analog signal within its said specified amplitude ranges present at its input to be represented by that said initial conversion digit value combination on which this said modified conversion digit value combination is based.

30. An analog-to-digital converter system for converting selected analog signal values from an analog signal provided at a converter system input to a digital representation of a substantially equivalent value, said digital representation being formed by a plurality of representation signals having a first subset thereof containing representation signal values representating a scaled number mantissa for said substantially equivalent value and a second subset thereof containing representation signal values representing that power to which a base value must be raised to give a scaling value by which said mantissa must be multiplied to provide said substantially equivalent value, said converter system comprising:

- a receiving means electrically connected to said converter system input and having an output at which analog representations of said selected analog signal values are provided;
- a plurality of analog-to-digital converter means, including a first analog-to-digital converter means and a second analog-to-digital converter means, each having an input for receiving analog signal values including first and second converter means inputs, and each having a plurality of outputs including first and second converter means outputs, each of said analog-to-digital converter means being capable of providing at each one of its corresponding said converter means outputs a digit signal of a selected value to thereby provide a corresponding plurality of digit signals for each one of said plurality of analog-to-digital converter means, including first and second pluralities of digit signals being provided at said first and second converter means outputs corresponding to said first and second analog-to-digital converter means, respectively, such that those values taken by each of said digit signals in differing combinations in a said corresponding plurality of digit signals permits that said plurality of digit signals to represent analog signal values provided at its corresponding said converter means input, which have amplitudes within specified amplitude ranges, by providing an alternative initial conversion digit value combination for each of such specified amplitude range analog signal values, but with at least some analog signal values outside said specified amplitude ranges being represented by corresponding initial conversion digit value combinations substantially identical to one another, said first analog-to-digital converter means input being electrically connected to said receiving means output;
- a first analog signal amplifier having an input and an output with said first amplifier being capable of providing at said first amplifier output a signal substantially similar to a signal provided at said first amplifier input but of a selected magnitude to provide a gain ratio therebetween, said first amplifier input being electrically connected to said first analog-to-digital converter means input and said first amplifier output being electrically connected to said second analog-to-digital converter means input; and
- an acceptance means having a plurality of inputs at which said acceptance means is capable of receiving said digit signals, said acceptance means having at least a portion of said acceptance means inputs electrically connected to both said first and second analog-to-digital converter means outputs for each said analog representation of a said selected analog signal value to receive therefrom corresponding said initial conversion digit value combinations for subsequent manipulation, and said acceptance means having a storage means therein capable of storing therein for a selectable time those said initial conversion digit value combinations provided by both the said first and second analog-to-digital converters.

31. The apparatus of claim 30 wherein said storage means has storage means outputs at which it is capable of providing those said conversion digit value combinations stored, and which further comprises a retrieval means for receiving said conversion digit value combinations provided at said storage means outputs.

32. The apparatus of claim 31 wherein said retrieval means is a scanning means which is capable of providing selected modifications to any of said initial conversion digit value combinations received from said storage means to thereby form at least one modified conversion digit value combination corresponding to one said initial conversion digit value combination for each said selected analog signal value, and being further capable of selecting a modified conversion digit value combination so formed for each said analog representation of a said selected analog signal value based on it being due to that corresponding one of said first and second analog-to-digital converter means having an analog signal within its said specified amplitude ranges present at its input to be represented by that said initial conversion digit value combination on which this said modified conversion digit value combination is based, said scanning means also being capable of providing said plurality of representation signals with said first subset of representation signal values based on said modified conversion digit value combinations so selected, and said second subset of representation signal values based, selectively, on any of said plurality of analog-to-digital converter means which have a said analog representation of a said selected analog signal value provided thereto of an amplitude beyond said specified amplitude ranges.

33. The apparatus of claim 32 wherein said modified conversion digit value combination comprises substantially its corresponding said initial conversion digit value combination with offset values introduced therein by said converter system removed.

34. The apparatus of claim 32 wherein said modified conversion digit value combination comprises substantially its corresponding said initial conversion digit value combination with gain error values introduced therein by said converter system removed.

35. The apparatus of claim 32 wherein only a first fraction of those digit values in said selected modified conversion digit value combinations are used as a basis of providing said first subset of representation signal values, said scanning means being further capable of selecting said first fraction of said digit values from said selected modified conversion digit value combinations for each said analog representation of each said selected analog value based on at least one digit value in said first fraction of digit values, and is further capable of selecting a second fraction of said digit values from said selected modified conversion digit value combinations which exclude any of said first fraction of said digit values and of providing a count of said second fraction of digit values so selected, said second subset of representation signal values being based also on said second fraction of digit values.

36. The apparatus of claim 35 wherein said second subset of representation signal values, insofar as being based on said second fraction of digit values, is based on said count.

37. The apparatus of claim 35 wherein determination of those of said digit values which are included in said first fraction of digit values is based on a relationship of each to that said digit value which is of greatest numerical representational value in that said modified conversion digit value combination for a said analog representation of a said selected analog signal value which has a selected number of digit values with such a relationship.

38. The apparatus of claim 37 wherein said specified amplitude ranges exclude a fraction of those amplitude ranges in which said first and second analog-to-digital converter means are capable of representing analog signal values provided thereto through providing alternative initial conversion digit value combinations therefor, and said excluded fraction is greater than that fraction of those same amplitude ranges which would be needed to represented offsets introduced into said conversion digit value combinations by said converter system.

39. An analog-to-digital converter system for converting selected analog signal values from an analog signal provided at a converter system input to a digital representation of a substantially equivalent value, said digital representation being formed by a plurality of representation signals having a first subset thereof containing representation signal values representing a scaled number mantissa for said substantially equivalent value and a second subset thereof containing representation signal values representing that power to which a base value must be raised to give a scaling value by which said mantissa must be multiplied to provide said substantially equivalent value, said converter system comprising:

a receiving means electrically connected to said converter system input and having an output at which analog representations of said selected analog signal values are provided, said receiving means comprising a plurality of analog signal amplifiers each having an input and an output, including a first analog signal amplifier having a first amplifier input and a first amplifier output, with each said analog signal amplifier being capable of providing at its output a signal substantially similar to a signal provided at its input but of a selected magnitude to provide a gain ratio therebetween, said first amplifier input being electrically connected to said converter system input, said receiving means also comprising a switching means having a plurality of input terminals including first and second switch input terminals and an output terminal such that any of said switch input terminals can be selectively and alternatively electrically connected to said switch output terminal, said switch first input terminal being electrically connected to said converter system input, said switch second input terminal being electrically connected to said first amplifier output, and said switch output terminal being electrically connected to said receiving means output, said switch sequentially connecting each of said first and second switch inputs to said switch output for each said selected analog signal value provided to said converter system input thereby providing said analog representations thereof;

an analog-to-digital converter means having an input electrically connected to said receiving means output to receive said analog representations of said selected analog signal values and having a plurality of outputs, said analog-to-digital converter means being capable of receiving said analog representations of said selected analog signal values and being capable of providing at each of said converter means outputs a digit signal of a selected value to thereby provide a plurality of digit signals such that those values taken by each of said digit signals in differing combinations permit said plurality of digit signals to represent analog signal values provided at said converter means input, which have amplitudes within specified amplitude ranges, by providing an alternative initial conversion digit value combination for each of such specified amplitude range analog signal values, but with at least some analog signal values outside said specified amplitude ranges being represented by initial conversion digit value combinations substantially identical to one another; and an acceptance means having a plurality of inputs at which said acceptance means is capable of receiving said digit signals, said acceptance means having at least a portion of said acceptance means inputs electrically connected to said converter means outputs for each said analog representation of a said selected analog signal value to receive therefrom corresponding said conversion digit value combinations and storing them therein for subsequent manipulation.

40. The apparatus of claim 39 wherein said storage means has storage means outputs at which it is capable of providing those said conversion digit value combinations stored, and which further comprises a retrieval means for receiving said conversion digit value combinations provided at said storage means outputs.

41. The apparatus of claim 40 wherein said retrieval means is a scanning means which is capable of providing selected modifications to any of said initial conversion digit value combinations received from said storage means to thereby form at least one modified conversion digit value combination corresponding to one said initial conversion digit value combination for each said selected analog signal value, and being further capable of selecting a modified conversion digit value combination so formed for each said analog representation of a said selected analog signal value based on it being due to said analog-to-digital converter means having an analog signal within its said specified amplitude ranges present at its input to be represented by that said initial conversion digit value combination on which said modified conversion digit value combination is based, said scanning means also being capable of providing said plurality of representation signals with said first subset of representation signal values based on said modified conversion digit value combinations so selected, and with said second subset of representation signal values based, selectively, on those gain ratios of any of said plurality of analog signal amplifiers which provide a said analog representation of a said selected analog signal value to said converter means input of an amplitude beyond said specified amplitude ranges.

42. The apparatus of claim 41 wherein said modified conversion digit value combination comprises substantially its corresponding said initial conversion digit value combination with offset values introduced therein by said converter system removed.

43. The apparatus of claim 41 wherein said modified conversion digit value combination comprises substantially its corresponding said initial conversion digit value combination with gain error values introduced therein by said converter system removed.

44. The apparatus of claim 41 wherein only a first fraction of those digit values in said selected modified conversion digit value combinations are used as a basis of providing said first subset of representation signal values, said scanning means being further capable of selecting said first fraction of said digit values from said selected modified conversion digit value combinations for each said analog representation of each said selected analog value based on at least one digit value in said first fraction of digit values, and is further capable of selecting a second fraction of said digit values from said selected modified conversion digit value combinations which exclude any of said first fraction of said digit values and of providing a count of said second fraction of digit values so selected, said second subset of representation signal values being based also on said second fraction of digit values.

45. The apparatus of claim 44 wherein said second subset of representation signal values, insofar as being based on said second fraction of digit values, is based on said count.

46. The apparatus of claim 44 wherein determination of those of said digit values which are included in said first fraction of digit values is based on a relationship of each to that said digit value which is of greatest numerical representational value in that said modified conversion digit value combination for a said analog representation of a said selected analog signal value which has a selected number of digit values with such relationship.

47. The apparatus of claim 46 wherein said specified amplitude ranges exclude a fraction of those amplitude ranges in which said analog-to-digital converter means is capable of representing analog signal values provided thereto through providing alternative initial conversion digit value combinations therefor, and said excluded fraction is greater than that fraction of those same amplitude ranges which would be needed to represent offsets introduced into said conversion digit value combinations by said converter system.

48. A method for converting selected analog signal values from an analog signal provided at a converter system input to a digital representation of a substantially equivalent value, said digital representation being formed by a plurality of representation signals having a first subset thereof containing representation signal values representing a scaled number mantissa for said substantially equivalent value and a second subset thereof containing representation signal values representing that power to which a base value must be raised to give a scaling value by which said mantissa must be multiplied to provide said substantially equivalent value, said method comprising:

providing a plurality of differing analog representations for at least some of said selected analog signal values;

converting each of said analog representations provided for each said selected analog signal value to a corresponding conversion digit value combination and modifying at least one of said conversion digit value combinations in value based on a plurality of conversion digit value combinations previously converted with that one combination thereafter representing a value substantially equivalent to that of said analog representation to which it corresponds;

selecting a representation of a said conversion digit value combination from among those representations of said conversion digit value combinations resulting from said converting for each said selected analog signal value based on said conversion digit value combination representation selected having its corresponding conversion digit value combination (a) representing a value substantially equivalent to that of said analog representation to which is corresponds, and (b) being within a specified portion of that range of values which said conversion digit value combinations can take; and providing said plurality of representation signals with said first subset of representation signals based on said conversion digit value combination representation so selected, and said second subset of representation signal values based on a relationship of that magnitude of said analog representation corresponding to said conversion digit value combination representation so selected to magnitudes of other analog representations provided for a said selected analog signal value.

49. The method of claim 48 wherein said modifying comprises removing from said conversion digit value combinations offset values introduced therein by said converter system to thereby form representations thereof.

50. The method of claim 48 wherein said modifying comprises removing from at least some of said conversion digit value combinations gain error values introduced therein by said converter system to thereby form representation thereof.

51. The method of claim 49 wherein said removing of said offset values is followed by, and said selecting is preceded by, removing from at least some of said conversion digit value combinations gain error values introduced therein by said converter system to thereby form altered representations thereof.

52. The method of claim 49 wherein said removing of said offset values is accomplished by forming an average of values of corresponding conversion digit value combinations for at least some of said selected analog signal values and substracting this average from values of corresponding conversion digit value combinations from other said selected analog signal values for which said offset value is to be removed.

53. The method of claim 50 wherein said removing of gain errors is accomplished by forming a first sum of values of corresponding said conversion digit value combinations obtained from chosen ones of said selected analog signal values which corresponding said conversion digit value combinations used for said first sum together form a first correspondence set, forming a second sum of values of other corresponding conversion digit value combinations which together form a second correspondence set and are obtained from those same chosen ones of said selected analog signal values, said first correspondence set conversion digit value combinations and said second correspondence set conversion digit value combinations having a desired gain relationship therebetween, dividing said first sum by said second sum to find an actual gain relationship therebetween, determining a gain error correction factor by dividing said actual gain relationship by said desired gain relationship, multiplying by said gain error correction factor a said corresponding conversion digit value combination from a said selected analog signal value from which a gain error is to be removed, other than a said chosen one, and which corresponds to those in said second correspondence set.

54. The method of claim 51 wherein said removing of said offset values is accomplished by forming an average of values of corresponding conversion digit value combinations for at least some of said selected analog signal values and subtracting this average from values of corresponding conversion digit value combinations from other said selected analog signal values for which said offset value is to be removed, and wherein said removing of gain errors from at least some of those conversion digit value combinations from which said offset values are removed as aforesaid by forming a first sum of values of corresponding said conversion digit value combinations obtained from chosen ones of said selected analog signal values which corresponding conversion digit value combinations used for said first sum together form a first correspondence set, forming a second sum of values of other corresponding conversion digit value combinations which together form a second correspondence set and are obtained from those same chosen ones of said selected analog signal values, said first correspondence set conversion digit value combinations and said second correspondence set conversion digit value combinations having a desired gain relationship therebetween, dividing said first sum by said second sum to find an actual gain relationship therebetween, determining a gain error correction factor by dividing said actual gain relationship by said desired gain relationship, multiplying by said gain error correction factor a said corresponding conversion digit value combination from a said selected analog signal value from which a gain error is to be removed, other than a said chosen one, and which corresponds to those in said second correspondence set.

55. A method for converting selected analog signal values from an analog signal provided at a converter system input to a digital representation of a substantially equivalent value, said digital representation being formed by a plurality of representation signals having a first subset thereof containing representation signal values representing a scaled number mantissa for said substantially equivalent value and a second subset thereof containing representation signal values representing that power to which a base value must be raised to give a scaling value by which said mantissa must be multiplied to provide said substantially equivalent value, said method comprising:

providing a plurality of differing analog representations for at least some of said selected analog signal values;

converting each of said plurality of analog representations provided for each said selected analog signal value to a corresponding conversion digit value combination with at least one of said conversion digit value combinations representing a value substantially equivalent to that of said analog representation to which it corresponds; and storing for a selected time each of said conversion digit value combinations resulting from said converting for each said selected analog signal value.

56. The method of claim 55 wherein said storing is followed by retrieving said conversion digit value combinations from storage to provide them for selecting a representation of a said conversion digit value combination to provide said plurality of representation signals.

57. The method of claim 56 wherein said selecting of a representation of a said conversion digit value combination proceeds by selecting a representation from among those representations of said conversion digit value combinations resulting from said converting for each said selected analog signal value based on said conversion digit value combination representation selected having its corresponding conversion digit value combination (a) representing a value substantially equivalent to that of said analog representation to which it corresponds, and (b) being within a specified portion of that range of values which said conversion digit value combinations can take, and providing said plurality of representation signals with said first subset of representation signals based on said conversion digit value combination representations so selected, and said second subset of representation signal values based on a relationship of that magnitude of said analog representation corresponding to said conversion digit value combination representation so selected to magnitudes of other analog representations provided for a said selected analog signal value.

58. The method of claim 57 wherein said converting is followed by, and said selecting is preceded by, removing from said conversion digit value combinations offset values introduced therein by said converter system to thereby form representations thereof.

59. The apparatus of claim 57 wherein said converting is followed by, and said selecting is preceding by, removing from at least some of said conversion digit value combinations gain error values introduced therein by said converter system to thereby form representation thereof.

60. The method of claim 58 wherein said removing of said offset values is followed by, and said selecting is preceded by, removing from at least some of said conversion digit value combinations gain error values introduced therein by said converter system to thereby form further representations thereof.

61. The method of claim 58 wherein said removing of said offset values is accomplished by forming an average of values of corresponding conversion digit value combinations for at least some of said selected analog signal values and subtracting this average from values of corresponding conversion digit value combinations from other said selected analog signal values for which said offset value is to be removed.

62. The method of claim 59 wherein said removing of gain errors is accomplished by forming a first sum of values of corresponding said conversion digit value combinations obtained from chosen ones of said selected analog signal values which corresponding said conversion digit value combinations used for said first sum together form a first correspondence set, forming a second sum of values of other corresponding conversion digit value combinations which together form a second correspondence set and are obtained from those same chosen ones of said selected analog signal values, said first correspondence set conversion digit value combinations and said second correspondence set conversion digit value combinations having a desired gain relationship therebetween, dividing said first sum by said second sum to find an actual gain relationship therebetween, determining a gain error correction factor by dividing said actual gain relationship by said desird gain relationship, multiplying by said gain error correction factor a said corresponding conversion digit value combination from a said selected analog signal value from which a gain error is to be removed, other than a said chosen one, and which corresponds to those in said second correspondence set.

63. The method of claim 60 wherein said removing of said offset values is accomplished by forming an average of values of corresponding conversion digit value combinations for at least some of said selected analog signal values and substracting this average from values of corresponding conversion digit value combinations from other said selected analog signal value for which said offset value is to be removed, and wherein said removing of gain errors from at least some of those conversion digit value combinations from which said offset values are removed as aforesaid by forming a first sum of values of corresponding said conversion digit value combinations obtained from chosen ones of said selected analog signal values which corresponding said conversion digit value combinations used for said first sum together form a first correspondence set, forming a second sum of values of other corresponding conversion digit value combinations which together form a second correspondence set and are obtained from those same chosen ones of said selected analog signal values, said first correspondence set conversion digit value combinations and said second correspondence set conversion digit value combinations having a desired gain relationship therebetween, dividing said first sum by said second sum to find an actual gain relationship therebetween, determining a gain error correction factor by dividing said actual gain relationship by said desired gain relationship, multiplying by said gain error correction factor a said corresponding conversion digit value combination from said selected analog signal value from which a gain error is to be removed, other than a said chosen one, and which corresponds to those in said second correspondence set.

* * * * *

UNITED STATES PATENT AND TRADEMARK OFFICE
CERTIFICATE OF CORRECTION

PATENT NO. : 4,823,129
DATED : April 18, 1989
INVENTOR(S) : John H. Nelson

It is certified that error appears in the above-identified patent and that said Letters Patent is hereby corrected as shown below:

Column 29, line 37, delete "said".

Column 30, line 40, delete "digital", insert --digit--.
Column 31, line 16, delete "splurality", insert --plurality--.

Column 33, line 11, delete "for", insert --to--.
Column 33, line 57, delete "said", insert --such--.
Column 36, line 1, delete "representation", insert --representational--.

Column 36, line 8, delete "the", insert --that--.
Column 36, line 25, delete "representation", insert --representational--.

Column 44, line 58, delete "desird", insert --desired--.
Column 44, line 68, delete "substracting", insert --subtracting--.

Signed and Sealed this

Tenth Day of October, 1989

*Attest:*

DONALD J. QUIGG

*Attesting Officer*      *Commissioner of Patents and Trademarks*